US006598405B2

(12) United States Patent
Bell

(10) Patent No.: US 6,598,405 B2
(45) Date of Patent: *Jul. 29, 2003

(54) THERMOELECTRIC POWER GENERATION UTILIZING CONVECTIVE HEAT FLOW

(75) Inventor: Lon E. Bell, Altadena, CA (US)

(73) Assignee: BSST LLC, Irwindale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/918,999

(22) Filed: Jul. 31, 2001

(65) Prior Publication Data

US 2002/0148235 A1 Oct. 17, 2002

Related U.S. Application Data

(63) Continuation-in-part of application No. 09/860,725, filed on May 18, 2001.
(60) Provisional application No. 60/267,657, filed on Feb. 9, 2001.

(51) Int. Cl.⁷ .................................................. F25B 21/02
(52) U.S. Cl. .............................................. 62/3.3; 62/3.7
(58) Field of Search ........................ 62/3.1, 3.2, 3.3, 62/3.7; 165/80.3, 80.4; 136/203, 204, 205, 236.1

(56) References Cited

U.S. PATENT DOCUMENTS

| | | | |
|---|---|---|---|
| 3,635,037 A | | 1/1972 | Hubert |
| 3,681,929 A | | 8/1972 | Schering |
| 3,779,814 A | | 12/1973 | Miles et al. |
| 4,065,936 A | | 1/1978 | Fenton et al. |
| 4,730,459 A | | 3/1988 | Schlicklin et al. |
| 5,092,129 A | | 3/1992 | Bayes et al. |
| 5,228,923 A | * | 7/1993 | Hed ............................ 136/208 |
| 5,232,516 A | * | 8/1993 | Hed ............................ 136/204 |
| 5,592,363 A | * | 1/1997 | Atarashi et al. ............. 361/689 |
| 5,802,856 A | * | 9/1998 | Schaper et al. ................ 62/3.7 |
| 6,084,172 A | | 7/2000 | Kishi et al. |
| 6,096,966 A | * | 8/2000 | Nishimoto et al. .......... 136/205 |
| 6,334,311 B1 | | 1/2002 | Kim et al. |
| 6,346,668 B1 | | 2/2002 | McGrew |
| 6,347,521 B1 | | 2/2002 | Kadotani et al. |
| 2002/0014261 A1 | * | 2/2002 | Caillat et al. ................ 136/205 |

FOREIGN PATENT DOCUMENTS

JP    5-219765   *   8/1993   ................ 62/3.7

OTHER PUBLICATIONS

International Search Report dated Aug. 6, 2002.
A New Concept of Porous Thermoelectric Module Using a Reciprocating Flow for Cooling/Heating System (Numerical Analysis for Heating System), Shigeru Tada, Ryozo Echigo and Hideo Yoshida, 16$^{th}$ International Conference on Thermoelectrics (1997).
International Search Report dated Jun. 12, 2002.
H.J. Goldsmid, *Electronic Refrigeration*, Pion Ltd, 207 Brondesbury Park, London (1986).
Stanley W. Angrist, *Direct Energy Conversion*, 32 Ed. Ally & Bacon (1976).

* cited by examiner

*Primary Examiner*—Melvin Jones
(74) *Attorney, Agent, or Firm*—Knobbe Martens Olson & Bear LLP

(57) ABSTRACT

An improved efficiency thermoelectric power generation system is disclosed wherein convection is actively facilitated through a thermoelectric array, and the thermoelectric array is used to generate electrical power. Thermal power is convected through the thermoelectric array or arrays toward at least one side of the thermoelectric array, which leads to increased efficiency. Thermal power is applied to the array, creating a temperature gradient across the array. The thermoelectric system may also be combined with other power generation systems, forming a co-generation system.

48 Claims, 21 Drawing Sheets

THERMOELECTRIC POWER GENERATION UTILIZING CONVECTIVE HEAT FLOW

REFERENCE TO PRIOR PROVISIONAL APPLICATION

This Application is a continuation in part of U.S. patent application Ser. No. 09/860,725 filed on May 18, 2001 and is related to and claims the benefit of the filing date of prior filed U.S. Provisional Patent Application No. 60/267,657, filed Feb. 9, 2001.

BACKGROUND OF THE INVENTION

1. Field of the Invention

The present invention relates to improved thermoelectrics for converting a temperature differential to electrical energy with greater efficiency.

2. Description of the Related Art

Thermoelectric devices (TEs) utilize the properties of certain materials to develop an electrical potential across their terminals in the presence of a temperature differential across the TE. Conventional thermoelectric devices utilize P-type and N-type semiconductors as the thermoelectric material within the device. Some fundamental equations, theories, studies, test methods and data related to TEs for cooling and heating are described in Angrist, Stanley W., *Direct Energy Conversion, 3rd edition,* Allyn and Bacon, Inc., Boston, Mass. 2210, USA, (1976). The most common configuration used in thermoelectric devices today is illustrated in FIG. 1. Generally, P-type and N-type thermoelectric elements 102 are arrayed in an assembly 100 between two substrates 104. The thermoelectric elements 102 are connected in series via copper shunts 118 soldered to the ends of the elements 102. A temperature differential is applied via the thermal source 106 at temperature $T_H$ and a thermal sink 108 at temperature $T_C$ across the device. The Peltier effect causes a voltage 110 (V) to be generated at the device terminals 116 that can be used to drive a current 112 (I) through a load 114 ($R_0$).

FIG. 2 shows the flow of power within the system of FIG. 1. For simplicity, only two TE elements 202 are shown. The TE elements 202 are sandwiched between hot and cold substrates 204 and are electrically connected in series by shunts 218. The source 206 of input heat energy is maintained at temperature $T_H$ and the cold side source 208 is maintained at $T_C$. Power is extracted at the terminals of the shunts 218 and provided to the load where work (W) 214 is done. Heat $Q_H$ enters at the left with waste heat $Q_C$ leaving at the right. Internal losses $I^2R$ are distributed evenly, half each to the hot and cold sides.

The basic equations for TE power generating devices in the most common form are as follows:

$$q_C = \alpha I T_C + \tfrac{1}{2} I^2 R + K\Delta T \quad (1)$$

$$q_H = \alpha I T_H - \tfrac{1}{2} I^2 R + K\Delta T \quad (2)$$

$$W = q_H - q_C = \alpha I \Delta T - I^2 R = I^2 R_L \quad (3)$$

where $q_C$ is the heat exiting from the cold side, $q_H$ is the heat entering at the hot side, and W is the power dissipated in the load, wherein:

α=Seebeck Coefficient
I=Current Flow
$T_C$=Cold side absolute temperature
$T_H$=Hot side absolute temperature
$\Delta T = T_H - T_C$, the temperature difference
R=Electrical resistance of the thermoelectric device
K=Thermal conductance
$R_L$=Electrical resistance of the external load Herein α, R and K are assumed constant, or suitably averaged values over the appropriate temperature ranges. It is also assumed that heat and current flow are one-dimensional, and that conditions do not vary with time.

Further, to quantify the performance of the generator, the efficiency is given by:

$$\eta = \frac{W}{q_H} \quad (4)$$

combining (2) and (3) yields:

$$\eta = \frac{I^2 R_L}{\alpha I T_H - \tfrac{1}{2} I^2 R + K\Delta T} \quad (5)$$

To achieve maximum performance, the generator internal resistance must be suitably matched to that of the load. Introducing:

$$m = \frac{R_L}{R} \quad (6)$$

as the ratio of load resistance to internal resistance Equation (5) can be rewritten as:

$$\eta = \frac{m \frac{\Delta T}{T_H}}{(1+m) - \tfrac{1}{2}\frac{\Delta T}{T_H} + \frac{(1+m)^2}{ZT_H}} \quad (7)$$

where;

$$Z = \frac{\alpha^2}{RK} \quad (8)$$

is a material property known as the figure of merit

The optimum value of m is:

$$m_{max} = \sqrt{1+ZT_A} \quad (9)$$

wherein:

$$T_A = \tfrac{1}{2}(T_H + T_C) \quad (10)$$

the average temperature

Substituting (9) in (7), the maximum efficiency achieved is therefore:

$$\eta_{max} = \frac{(m_{max}-1)\frac{\Delta T}{T_H}}{m_{max} + \frac{T_C}{T_H}} \quad (10)$$

FIG. 3 depicts the efficiency of a thermoelectric generator for different hot side temperatures and different values of the figure of merit, Z. As can be seen from the graph, high values of Z and $T_H$ are needed to make thermoelectric generators efficient. Commercially available materials have $ZT_A \approx 1$ and some new, experimental materials have $ZT_A \approx 1.5$. Materials commonly used in thermoelectric generators include suitably doped lead telluride (PbTe) for $T_H \approx 500°$ C. or silicon germanium (SiGe) for $T_H \approx 1000°$ C. Generally, as better materials may become commercially available, they do not obviate the benefits of the present inventions.

From FIG. 3 it can be seen that theoretical efficiencies over 25% are possible. Practical considerations of unavoidable losses, present material limitations, and reliability have limited actual efficiencies to 4% to 8%. For today's materials, thermoelectric devices have certain aerospace and some commercial uses. However, usages are limited, because system efficiencies are generally too low to compete with those of other types of electrical generators. Nevertheless, several configurations for thermoelectric devices are in current use in applications where benefits from other qualities of TEs outweigh their low efficiency. These include applications requiring multi-year reliability without maintenance, heat flux sensing, conversion of waste heat, and power supplies for certain interplanetary spacecraft. In sum, in conventional devices, conditions can be represented by those described above.

SUMMARY OF THE INVENTION

The commercial devices have in common that the heat transport within the device is constrained by the material properties of the TE elements. None of the existing devices modifies the heat transport within the TE assembly.

An improved efficiency thermoelectric power generator is achieved by generally steady state convective heat transport within the device itself. Overall efficiency may be improved by designing systems wherein the TE system (elements or arrays) are configured to permit to the flow of a heat transport fluid, transport thermal energy to a moving substance, or move the TE material itself to transport heat. As an alternative to, or in combination with improved efficiency, generally steady state convection can be employed to reduce $q_C$, the heat flux to the waste (cold) side.

One aspect of the present invention involves a thermoelectric power generation system using at least one thermoelectric array. The array may be made up of a plurality of individual elements, or one or more arrays. The array has a hot side and a cold side exhibiting a temperature gradient between them during operation. In accordance with the present invention, at least a portion of the thermoelectric array is configured to facilitate convective heat transport through at least one array. To accomplish this, the array is configured to permit flow of at least one convective medium through at least a portion of the array to provide generally steady-state convective heat transport from one side to the other side of at least a portion of the array. In one embodiment, the flow is from the cold side to the hot side of at least a portion the thermoelectric array.

In one embodiment, the convective medium flows through at least some of the thermoelectric elements or along (between and/or around) the thermoelectric elements. In another embodiment, the convective medium flows both along and through the thermoelectric elements. In one preferred embodiment, to permit flow through the thermoelectric elements, the elements or the arrays may be permeable or hollow. A combination of both permeable and hollow elements may also be used in an array. In one embodiment, the elements are porous to provide the permeability. In another embodiment, the elements are tubular or have a honeycomb structure. All such flows may be generally within or along the length of the thermoelectric elements (including in a spiral) or a combination thereof.

In one particular embodiment, at least some of the thermoelectric elements form concentric tubes with convective medium flow between the concentric tubes. In one embodiment, a first set of concentric tubes forms a thermoelectric element, with each tubular portion made from thermoelectric material of the same conductivity type as the next tubular portion in the set of concentric tubes. In such an embodiment, a second set of concentric tubes is formed of a thermoelectric material of a different conductivity type from the first set. Alternatively, the tubes may concentrically alternate between p-type thermoelectric material and n-type thermoelectric material.

In another embodiment, at least part of the convective medium is thermoelectric material. The convective medium thermoelectric material then forms at least some of the thermoelectric elements. In addition, in one embodiment, at least part of the convective medium is thermoelectric material, with the convective medium thermoelectric material forming a first portion of at least some of the thermoelectric elements, and a solid thermoelectric material forming a second portion of the same thermoelectric elements. For example, the solid thermoelectric material is tubular or otherwise hollow, and the convective medium thermoelectric material flows through the solid thermoelectric material. The combination forms at least some thermoelectric elements. In one embodiment, the convective medium is a fluid, such as air, a solid or a combination of a fluid and solids such as a slurry.

In one configuration, a first plurality of the thermoelectric elements are configured for convective heat transport of a first type and a second plurality of the thermoelectric elements are configured for convective heat transport of a second type. For example, the first plurality of thermoelectric elements may be permeable, and the second plurality may be thermoelectric elements made from the convective material moving through the array. An example of a division of elements is the first plurality being thermoelectric elements of a first conductivity type and the second plurality being thermoelectric elements of a second conductivity type.

In another embodiment, at least some of the thermoelectric elements do not utilize convection, while others are configured for convection. For example, the thermoelectric elements that do not utilize convection are of a first conductivity type and the thermoelectric elements that utilize convection are of a second conductivity type.

Preferably, at least a portion of the array has at least one heat transfer feature that improves heat transfer between at least some of the convective medium and at least some of the thermoelectric elements or arrays. For example, where the thermoelectric elements or arrays are tubular or otherwise hollow, the heat transfer feature is inside at least some of the tubular thermoelectric elements. Where the convective medium flow along the outside of the thermoelectric elements, the heat transfer feature is between at least some of the thermoelectric elements. An example of such heat transfer feature is a convective medium flow disturbing feature.

In one further embodiment, at least one co-generator is configured to operate in conjunction with the thermoelectric power generation system. In one embodiment, at least a portion of the co-generator comprises at least one combustion process involving combustion of the convective medium. The combustion process may take place in at least one internal combustion engine, or at least one external combustion engine. Other combustion processes are also possible. For example, in one embodiment, the co-generator comprises at least one turbine generator. The turbine generator may operate using at least one expansion process involving expansion, phase change process of the convective medium, or combustion process. For example, the working fluid may be water changing phase to steam.

In one embodiment, the co-generator comprises at least one electrochemical process using the convective medium, such as a fuel cell. In another embodiment, a heating and/or cooling system, such as an absorption system is configured to operate at least in part with the convective medium from the thermoelectric power generator.

Another aspect of the present invention involves a method of improving efficiency in a thermoelectric power generation system having at least one thermoelectric array having at least one first side and at least one second side exhibiting at least one temperature gradient between them during operation of the thermoelectric power generation system through the introduction of heat to the system. The method involves the steps of actively convecting thermal power through at least a portion of the array in a generally steady-state manner and generating power from the at least one thermoelectric array.

In one embodiment, the step of convecting heat comprises flowing at least one convective medium through at least a portion of the at least one thermoelectric array. In a further embodiment, a further step is provided of co-generating power at least in part with the at least one convective medium. In one embodiment, the step of co-generating comprises combusting at least a portion of the at least one convective medium in at least one co-generator. In one embodiment, the co-generator comprises at least one turbine generator. The step of co-generating may alternatively comprise an expansion of at least a portion of the at least one convective medium. Similarly, the co-generating step may additionally or alternatively involve at least one electrochemical process, such as a fuel cell, with at least a portion of the at least one convective medium.

In yet another embodiment, the method further involves the step of heating or cooling at least in part with the at least one convective medium. An example of a cooling and/or heating system is an absorption system operation at least in part with the convective medium flowing through the thermoelectric power generator.

DETAILED DESCRIPTION OF THE PREFERRED EMBODIMENTS

The invention is introduced using examples and particular embodiments for descriptive purposes. A variety of examples described below illustrate various configurations that may be employed to achieve the desired improvements. In accordance with the present invention, the particular embodiments and examples are only illustrative and not intended in any way to restrict the inventions presented and the various aspects of these inventions. In addition, it should be understood that the terms cooling side, heating side, cold side, hot side, cooler side and hotter side and the like do not indicate any particular temperature, but are relative terms. For example, the "hot," "heating" or "hotter" side of a thermoelectric element or array may be at ambient temperature, with the "cold," "cooling" or "cooler" side at a cooler temperature than ambient. Conversely, the "cold," "cooling" or "cooler" side may be at ambient with the "hot," "heating" or "hotter" side at a higher temperature than ambient. Thus, the terms are relative to each other to indicate that one side of the thermolectric is at a higher or lower temperature than the counter-designated side.

Figure 4:
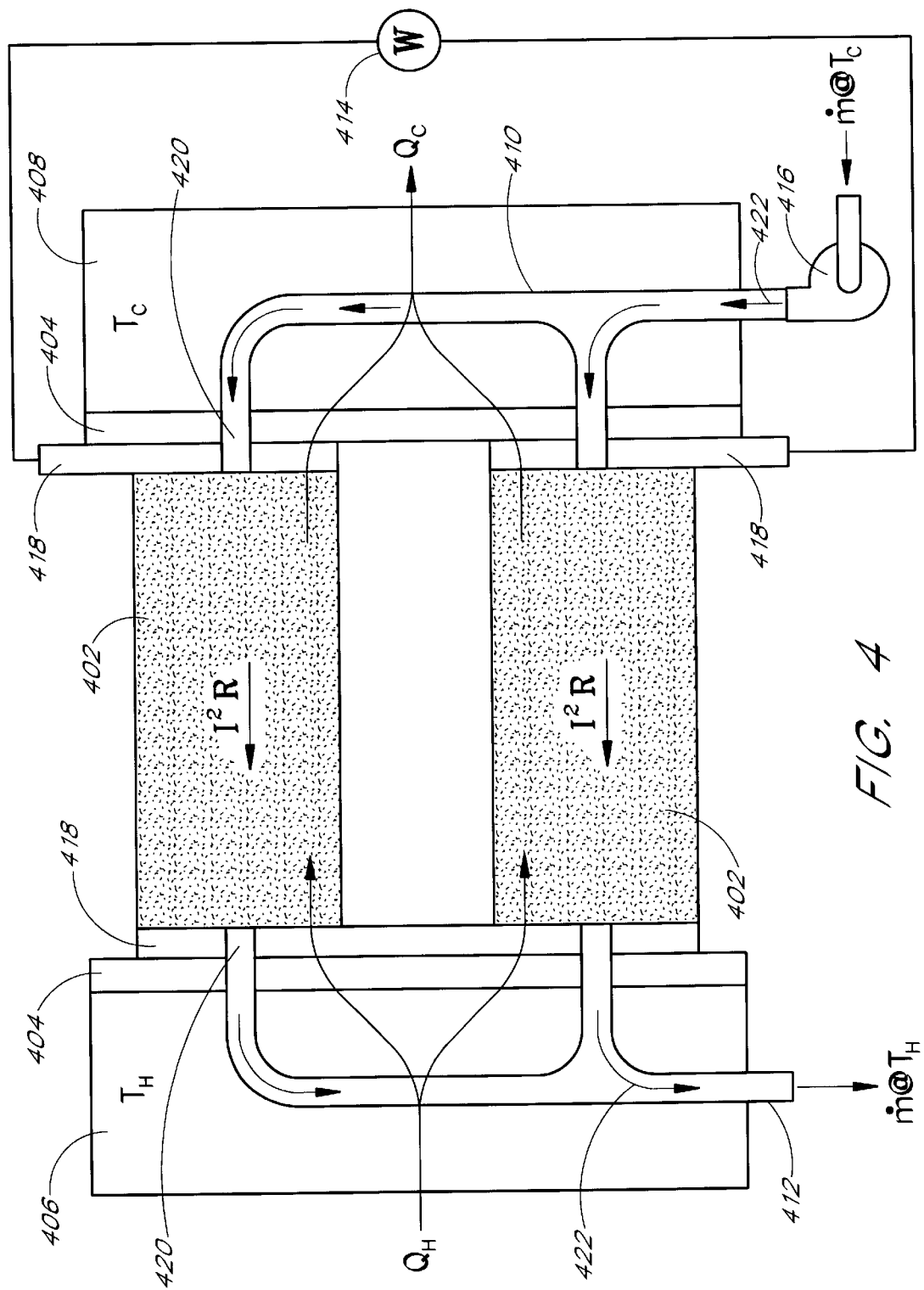
FIG. 4 depicts a thermoelectric power generating device that employs convective heat transfer within the device and illustrates the flow of power within it.

A first embodiment of a thermoelectric power generator is shown in FIG. 4. P-type and N-type thermoelectric elements 402 are arrayed in an assembly (only two elements shown for simplicity) between two substrates 404. In this particular embodiment, the thermoelectric elements 402 are preferably porous, or otherwise permit the flow of a fluid through them. More than two elements are generally used. However, two elements are sufficient for illustration purposes. In addition, although the term "thermoelectric elements" tends to suggest an individual P-type or N-type element, in the context of this description, arrays of thermoelectric elements could also be used. Thus, when an array of thermoelectric elements is presented, that terminology also refers to an array of arrays. For example, each of the so-called elements 402 may be made up from an array of many individual P-type and N-type elements. In one embodiment, the assembly is rectangular. Finally, the thermoelectric elements can be of any type, such as conventional elements, heterostructures, slurries of solids and liquids and nano structures as discussed in the literature, and also could be a combination of thermoelectric/thermoionic configurations or materials. Thus, the term thermoelectric element or thermoelectric material as used herein is intended in a broad sense.

The elements 402 are connected in series via copper shunts 418 soldered to the ends of the elements 402. A temperature differential is applied via the thermal source 406 at temperature $T_H$ and a thermal sink 408 at temperature $T_C$ across the device causing a voltage to be generated at the device terminals 418 thereby driving a current I through a load doing work 414 (W). A cold side manifold 410 and a hot side manifold 412 are built into the thermal sink 408 and the thermal source 406 respectively. The manifolds 410 and 412 connect to the ends of the TE elements 402 via holes 420 in the substrates 404 and the shunts 418. A convective fluid 422 at temperature $T_C$ is drawn in and pumped through the assembly by pump 416.

In operation, heat $Q_H$ enters the device at the left with heat $Q_C$ leaving the device at the right. A portion of the internally generated heat ($I^2R$ heat) is swept from left to right as the convective fluid (used very generally) 422 is heated as it passes through the TE elements 402. The convective fluid 422 enters the device at temperature $T_C$ and exits the device at temperature $T_H$. To better understand the way that convective heat transport affects the performance of the system according to the present invention, the equations that govern power generation and heat flow in a TE power generator that employs convective heat transport are developed below and contrasted with those discussed above for a conventional thermoelectric power generator. As in the description of power generation for a conventional device, it is assumed that material properties do not change with current and temperature, heat and current flow are one-dimensional, and that conditions do not vary with time. For this case a new parameter, δ, is introduced and is the ratio of convective to conductive heat transport within the device; i.e.

$$\delta = \frac{C_p \dot{M}}{K} \quad (11)$$

$$q_c = \alpha I T_C - \frac{1}{2} I^2 R \xi_\eta(-\delta) + K(\delta) \Delta T \quad (12)$$

$$q_H = \alpha I T_H - \frac{1}{2} I^2 R \xi_\eta(\delta) + K(\delta) \Delta T \quad (13)$$

$$W = q_H - q_C = \alpha I \Delta T - I^2 R = I^2 R_L \quad (14)$$

(same as Equation 3)
wherein;

$$\xi_\eta(\delta) = \frac{2}{\delta}\left[\frac{\delta + e^{-\delta} - 1}{1 - e^{-\delta}}\right] \quad (15)$$

$$K(\delta) = K\left(\frac{\delta e^{-\delta}}{1 - e^{-\delta}}\right) \quad (16)$$

If the heat content of the convective fluid exiting the device is fully utilized (to preheat a fuel prior to combustion, for example) or for some other purpose, equations (13) and (14) can be combined and the heat content of the convected fluid subtracted. The efficiency is given by:

$$\eta = \frac{W}{q_H - C_p \dot{M} \Delta T} = \frac{I^2 R_L}{\alpha I T_H - \frac{1}{2} I^2 R \xi(\delta) + K(\delta)\Delta T} \quad (17)$$

Note that as δ→∞, $q_C$→$\alpha I T_C$ allowing the radiator that maintains the cold sink at $T_C$ to be smaller. Also notice that K(δ) is a function of δ and approaches the conductive value K for δ→0. Also, for δ>0 a larger portion of the $I^2R$ heating losses are transported to the hot end. The term $\xi(\delta)/2$→½ when δ→0 as expected. Approximate values for $\xi(\delta)$ and K(δ)/K are given in Table 1.

TABLE 1

| δ | ξ (δ) | K(δ)/K |
|---|-------|--------|
| 0 | 1.000 | 1.000 |
| .1 | 1.017 | .951 |
| .2 | 1.033 | .903 |
| .5 | 1.083 | .771 |
| 1.0 | 1.164 | .582 |
| 2.0 | 1.313 | .313 |
| 5.0 | 1.614 | .034 |

Figure 1:
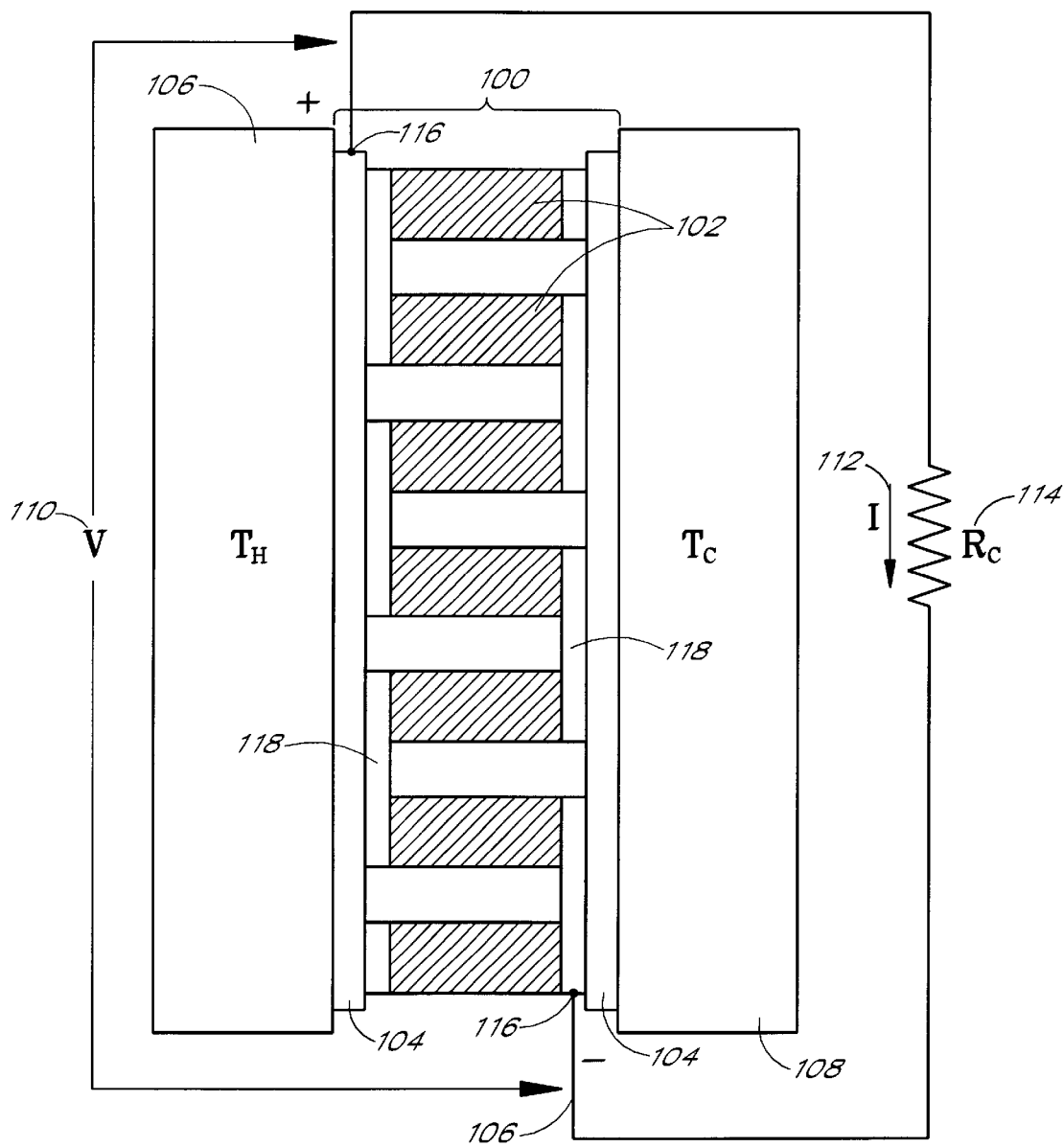
FIG. 1 depicts a conventional thermoelectric power generating device.
Figure 2:
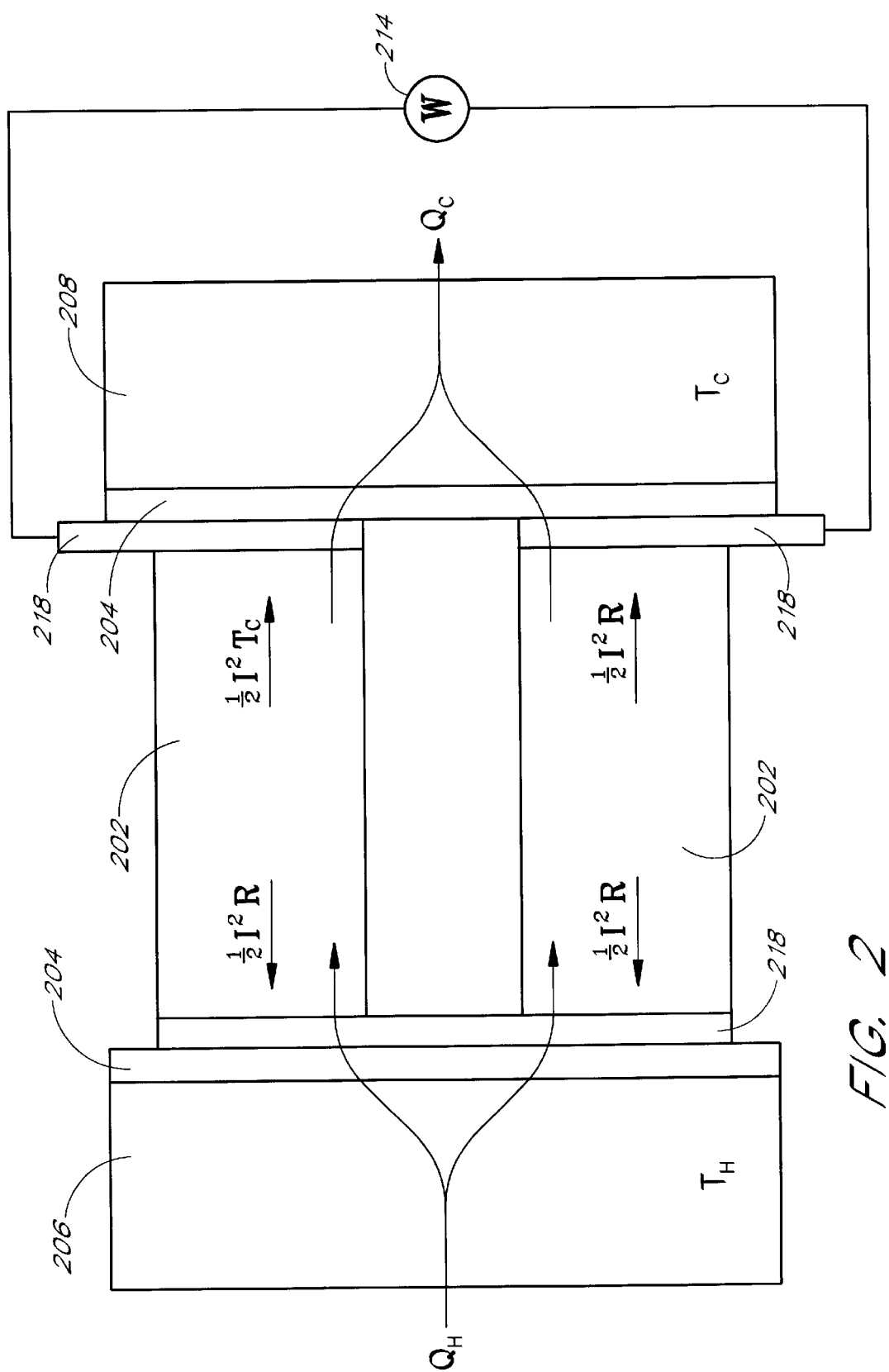
FIG. 2 illustrates the flow of power within and from a conventional thermoelectric power generating device.
Figure 3:
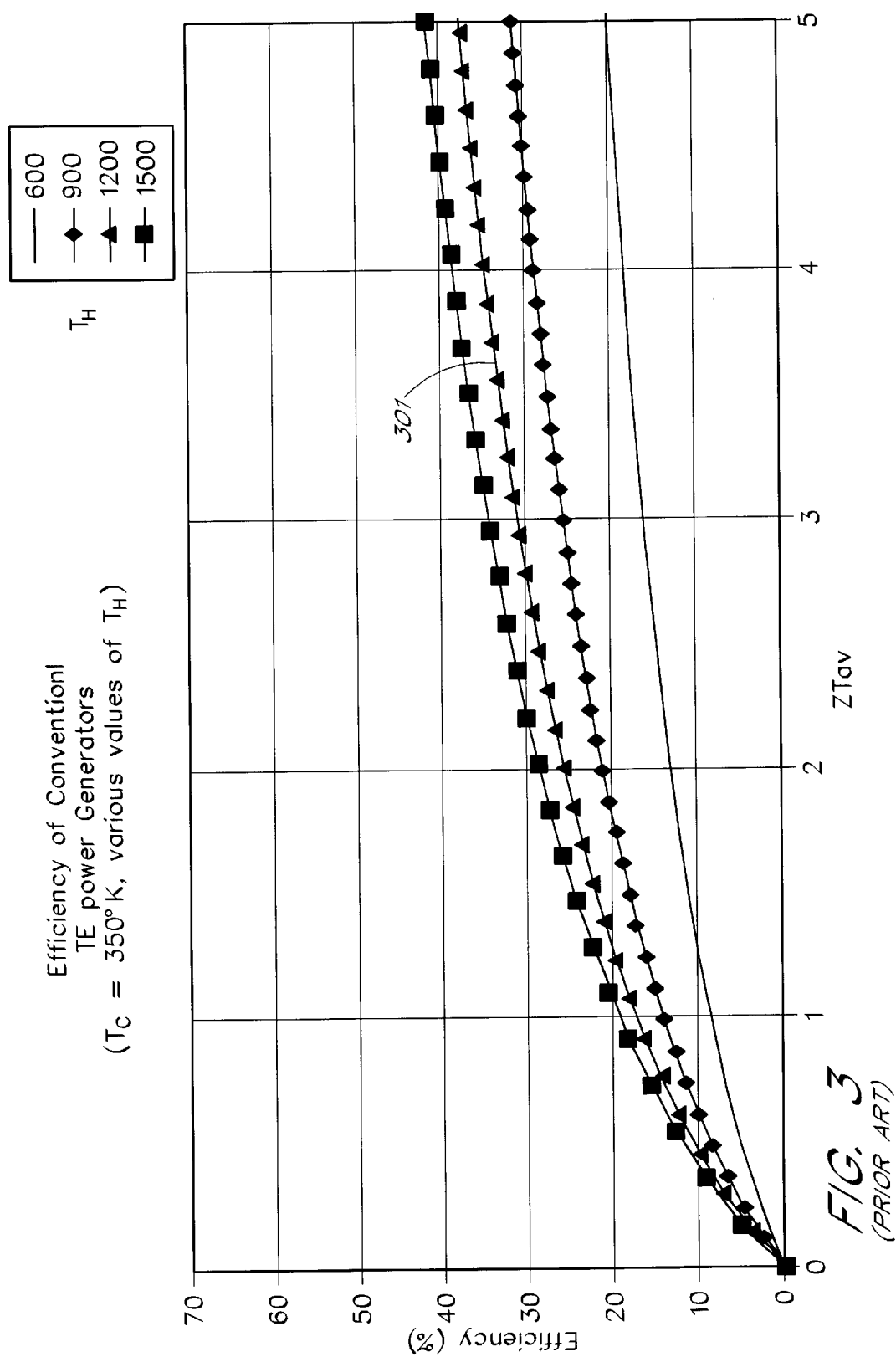
FIG. 3 depicts the theoretical efficiency that may be achieved with conventional thermoelectric power generating devices.
Figure 5:
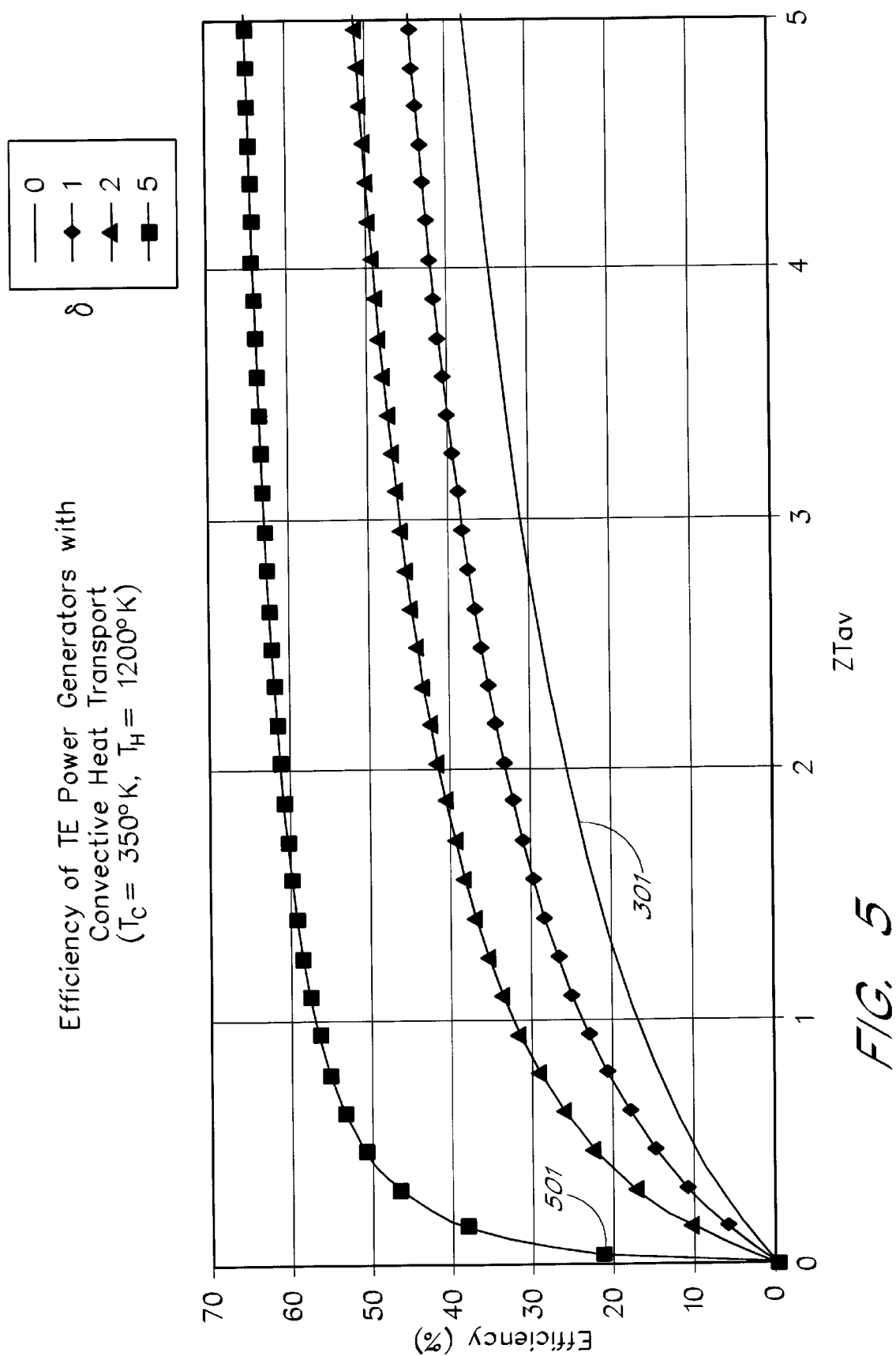
FIG. 5 depicts the theoretical efficiency that may be achieved with a thermoelectric power generating device that employs convective heat transfer and in which the heated convective fluid is utilized fully for some other purpose.

As can be seen from Table 1, the denominator of the efficiency equation (17) is made smaller as δ increases thereby increasing efficiency. The efficiency of such system with convection is depicted in FIG. 5 and may be compared to FIG. 3 (without convection). The curve 301 in both figures is the same, namely without convection and $T_H$=1200° K. As convection (δ) increases there is efficiency improvement for all values of Z. For δ≈5, efficiency is greatly increased even for very low values of Z. As illustrated in the figure, rather ordinary alloys (lower values of Z) such as those used in thermocouples can be used as the thermoelectric elements thus reducing both material and fabrication costs. For example, the point 501 curve 301 in FIG. 5 shows a bit over 20% efficiency for a P-type material of 90% Ni, 10% Cr working with an N-type material of 55% Cu, 45% Ni.

Figure 6:
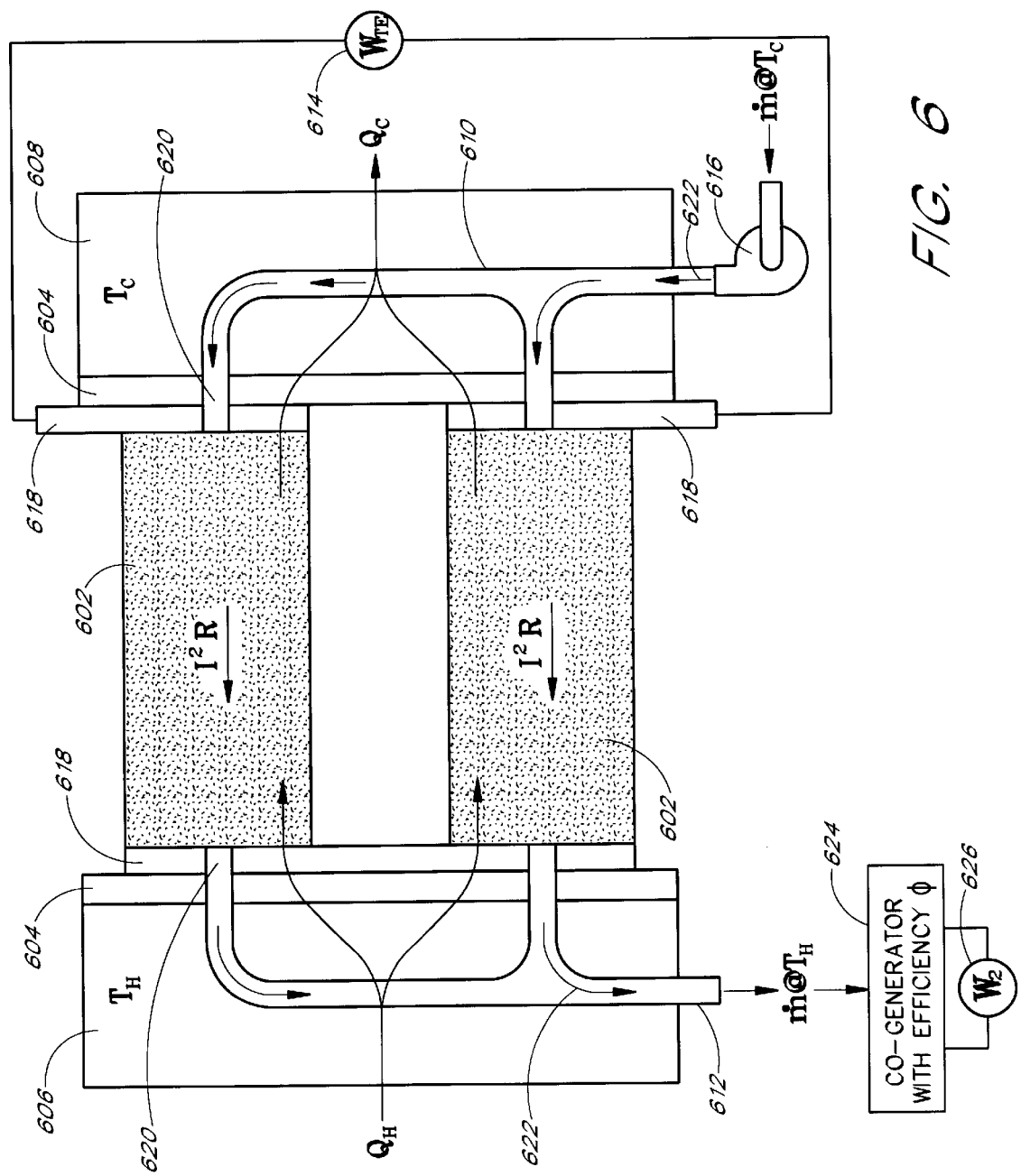
FIG. 6 depicts a thermoelectric power generating device that employs convective heat transfer within the device working in conjunction with a co-generation device and illustrates the flow of power within the system.

Another embodiment of an improved thermoelectric power generator is shown in FIG. 6. In this case, the thermoelectric power generator is working in conjunction with a co-generator such as a steam generator to produce electricity. P-type and N-type thermoelectric elements (including arrays of elements, as explained above) 602 are arrayed in an assembly (only two elements are shown for simplicity) between two substrates 604. In one embodiment, the assembly is rectangular. As above, in one embodiment, the thermoelectric elements (or arrays of elements) are porous or otherwise permit flow of a convective fluid through the element or array of elements. The elements 602 are connected in series via copper shunts 618 brazed to the ends of the elements 602. A temperature differential is applied via the thermal source 606 at temperature $T_H$ and a thermal sink 608 at temperature $T_C$ across the device causing a voltage to be generated at the device terminals 618 thereby driving a current I through a load doing work 614 ($W_1$). A cold side manifold 610 and a hot side manifold 612 are built into the thermal sink 608 and the thermal source 606 respectively. The manifolds 610 and 612 connect to the ends of the TE elements 602 via holes 620 in the substrates 604 and the shunts 618. A convective fluid (broadly defined) 622 at temperature $T_C$ is drawn in and pumped through the assembly by pump 616.

In operation, heat $Q_H$ enters the device at the left and heat $Q_C$ leaves the device at the right. Internally generated heat $I^2R$ is partially swept to from left to right by the heating of the convective fluid 622 as it passes through the TE elements 602. The convective fluid 622 enters the device at temperature $T_C$ and exits the device at temperature $T_H$ and is used to drive the co-generator 624 that produces work 626 ($W_2$). If the co-generator has efficiency $\phi$ then the work it generates is:

$$W_2 = \phi C_p \dot{M} \Delta T \qquad (18)$$

The efficiency of the system as a whole is then:

$$\eta = \frac{W_1 + W_2}{q_H} = \frac{W_1 + \phi C_p \dot{M} \Delta T}{q_H} = \frac{I^2 R_L + \phi K \Delta T}{\alpha I T_H - \frac{1}{2} I^2 R \xi(\delta) + K(-\delta)\Delta T} \qquad (19)$$

Figure 7:
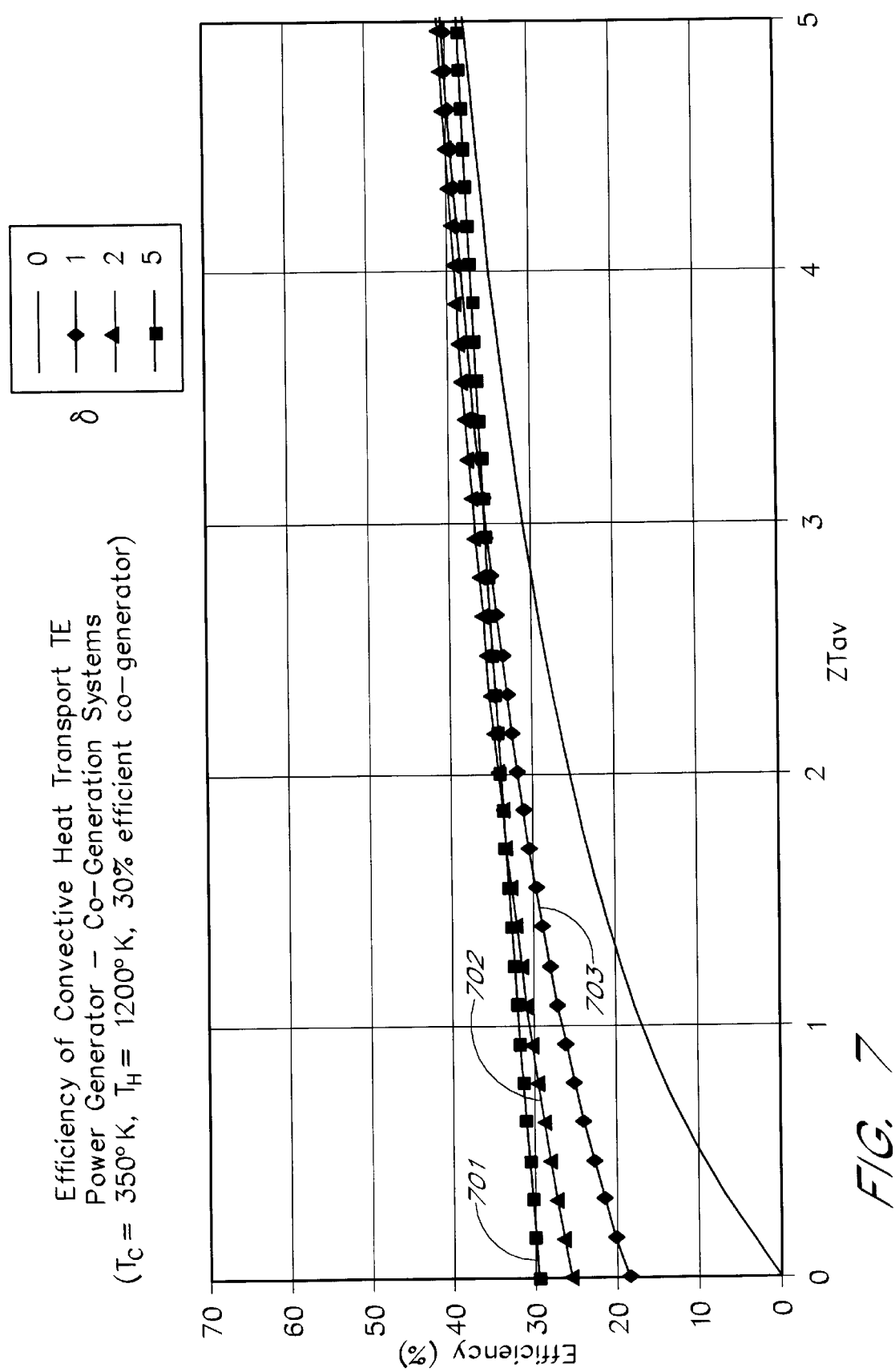
FIG. 7 depicts the overall system efficiency that may be achieved with a thermoelectric power generating device employing convective heat transport with an associated co-generating device.

The efficiency is reduced due to the increase in $K(-\delta)$ but is more than regained for sufficiently large values of $\delta$ by virtue of the co-generator's efficiency. This can be seen in FIG. 7 which shows that for co-generators of modest efficiency, the overall system efficiency is increased above that of the co-generator alone. The increase in efficiency begins for $\delta \approx 5$ at $ZT_{av}$ of about 0.1 (point 701); for $\delta \approx 2$ at $ZT_{av}$ of about 0.85 (point 702); and for $\delta \approx 1$ at $ZT_{av}$ of about 1.6 (point 703).

Figure 8:
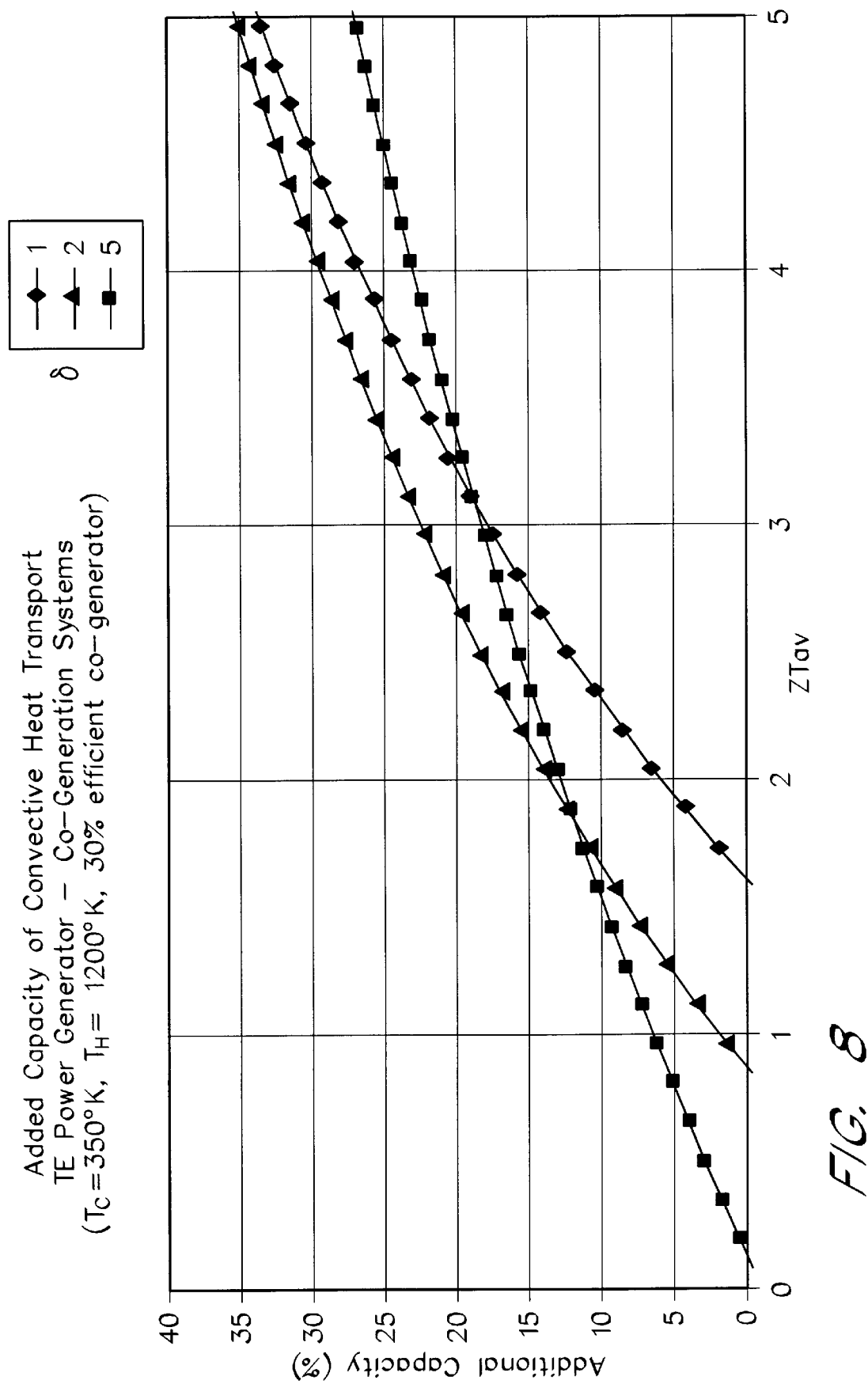
FIG. 8 depicts the capacity gains that can be achieved in a system utilizing a thermoelectric power generating device employing convective heat transport working in conjunction with a co-generating device.

Important gains in capacity output of the combined system are possible. FIG. 8 shows the added capacity of a system such as that described in FIG. 6. These gains become larger as Z increases. Convection adds significant capacity ZT up to 1.5. For larger values of ZT such as 2–4 as disclosed in Ghamaty, et al., U.S. Pat. Nos. 6,096,964 and 6,096,965 capacity increases of 30% are possible.

Figure 9:
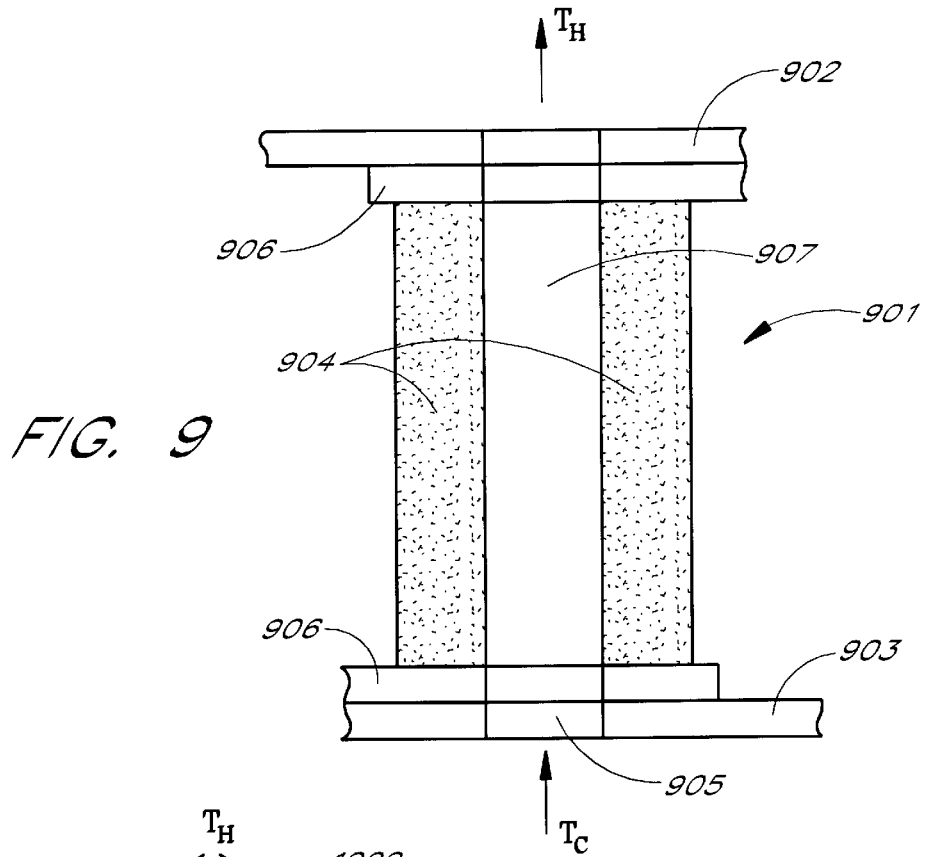
FIG. 9 depicts a detailed illustration of a portion of the TE element array showing a tubular TE element.

FIGS. 9 through 14 depict different embodiments of TE elements that can be used in place of the elements described in FIGS. 4 and 6. Preferably, the convective fluid and stationary elements are designed so as to have minimal temperature differences between them at any position along the direction of current within the TE elements or arrays of elements. FIG. 9 shows a portion 901 of a TE element array for use in a system such as that shown in FIG. 6 with a hot side substrate 902, a cold side substrate 903, circuitry 906, holes 905 through the substrates and circuitry, and a plurality of hollow, solid TE elements 904. The heat transfer fluid (which may for example be liquid TE material or another non-TE material fluid) enters holes in the cool side at temperature $T_C$ and exits the hot side at temperature $T_H$.

Figure 10:
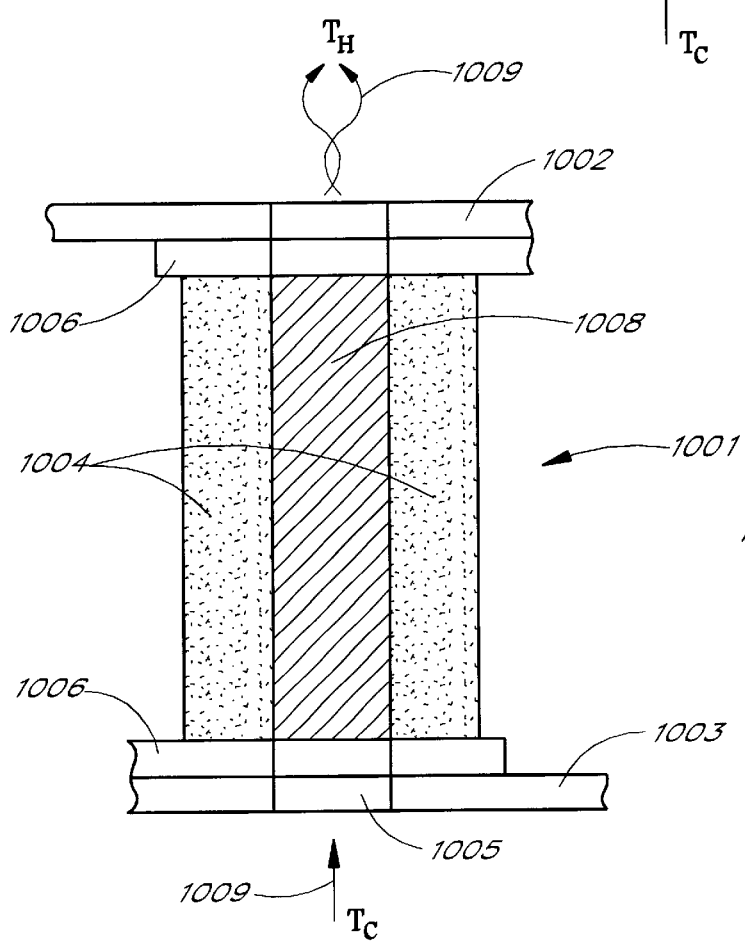
FIG. 10 depicts a detailed illustration of a portion of the TE element array showing a tubular TE element with mixing vanes.

FIG. 10 shows a portion 1001 of a thermoelectric array similar to that of FIG. 6 with a hot side substrate 1002, a cold side substrate 1003, circuitry 1006, holes 1005 through the substrates and circuitry, and a plurality of hollow TE elements 1004. FIG. 10 illustrates a heat transfer feature. One particular example is depicted in FIG. 10, which is a flow-disturbing feature to mix the flow. In FIG. 10, the heat transfer feature is depicted as spiral vanes 1008 placed inside the hollow (e.g., tubular) TE elements 1004. The vanes serve to spin and mix the heat transfer fluid 1009 thereby increasing the heat transfer from the TE elements 1004 to the heat transfer fluid 1009. Any feature that improves heat transfer between the thermoelectric elements and the convective medium as it flows past or through the TE elements, provided that it does not greatly inhibit flow, will suffice.

Figure 11A:
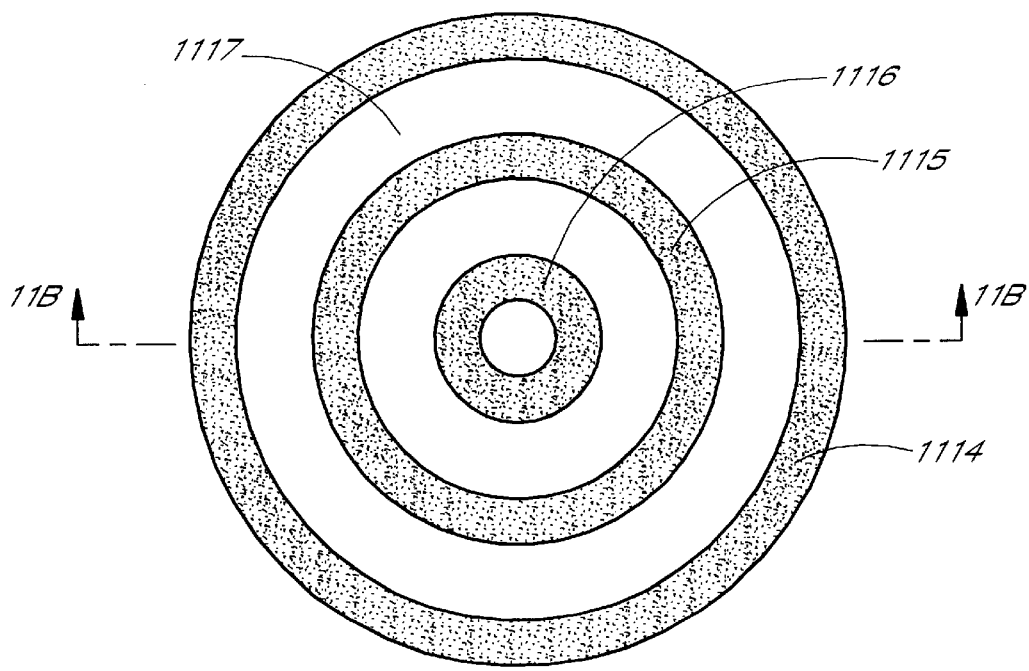
FIGS. 11A and 11B depicts a detailed illustration of a portion of the TE element array showing a TE element composed of nested concentric tubes.
Figure 11B:
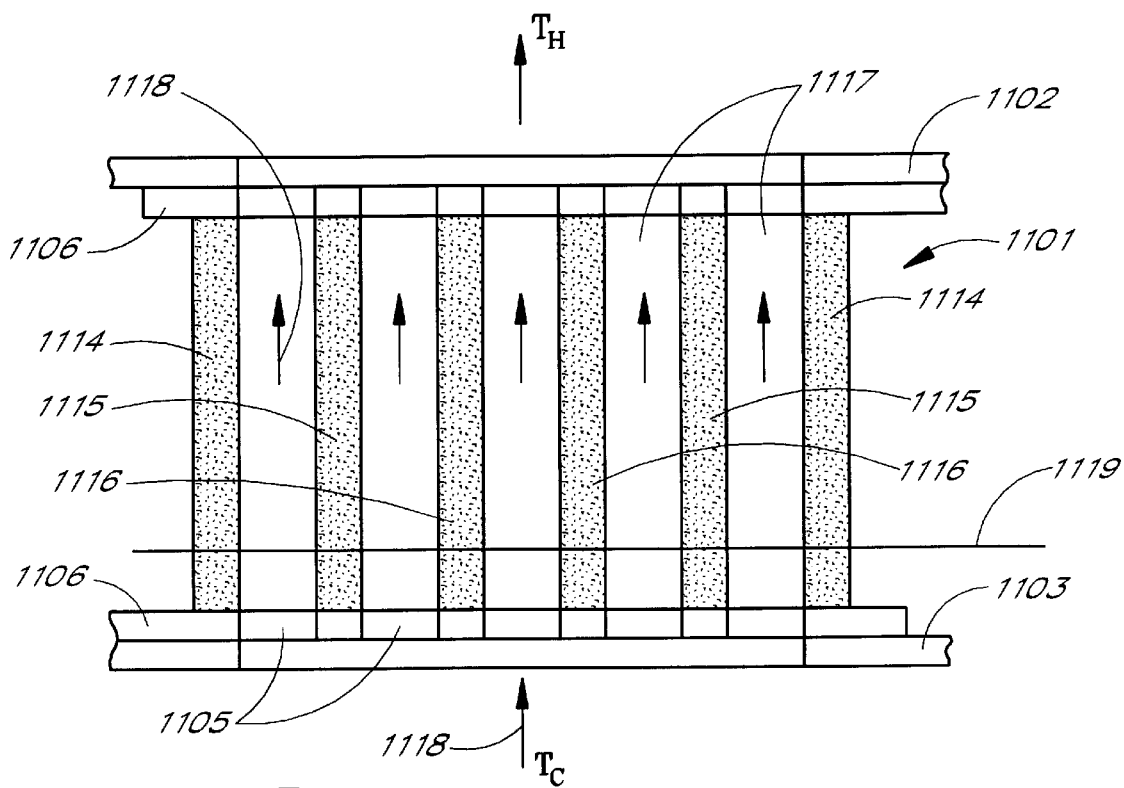

FIGS. 11A and 11B depict a construction of a TE array 1101 in which the TE elements form concentric tubes 1114–1116. FIG. 11A depicts a top view of the thermoelectric elements 1114, 1115 and 1116. FIG. 11B shows a cross-section through B—B of FIG. 11A, and adds the substrates 1102, 1103 and circuitry 1106 along with illustrating the fluid flow from the bottom at $T_C$ to top at $T_H$. The TE array 1101 consists of hot and cool side substrates 1102 and 1103, circuitry 1106, and the tubes 1114, 1115, and 1116. In this particular configuration, the tubes are concentric. However, concentricity is not required, nor is the tubular form. For example, manufacturing considerations may dictate the particular configuration. The holes in the circuitry and substrate 1105 are aligned with the annular gaps 1117 between the tubes 1114, 1115, 1116. Heat transfer fluid 1118 passes through the annular gaps 1117. In FIG. 11, three concentric tubes are shown as an example. In this example, the tubes may alternate concentrically between p-type and n-type. Alternatively, the concentric tubes may each be of the same conductivity type, with the other conductivity-type thermoelectric elements formed of another set of concentric tubes. The number of tubes can be any practical number. Furthermore, the heat transfer fluid 1118 can also be directed over the outside diameter largest tube. Once again, the tubes 1114, 1115, and 1116 are designed to be close to thermal equilibrium with the fluid 1118 along any line 1119 parallel to and between the substrates 1102 and 1103.

Figure 12:
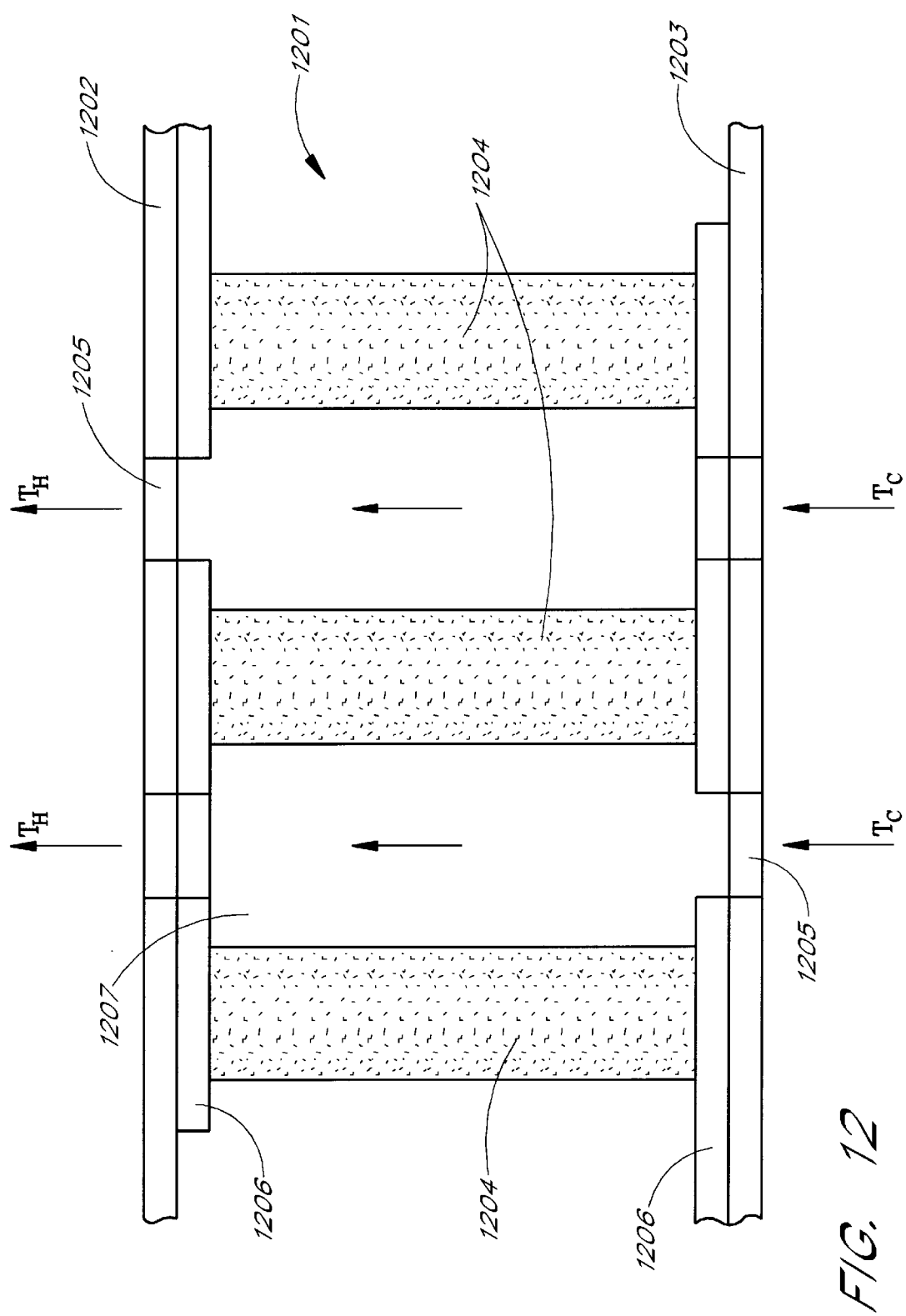
FIG. 12 depicts a detailed illustration of a portion of the TE element array showing convection along the length of the TE elements.

FIG. 12 shows yet another configuration for a TE array 1201 constructed with a plurality of solid TE elements 1204 around which heat transfer fluid 1207 flows. The TE array 1201 is constructed like those described above having hot and cool side substrates 1202 and 1203, circuitry 1206 and holes 1205 in the circuitry and substrates to allow the heat transfer fluid 1207 to flow through the array.

Figure 13A:
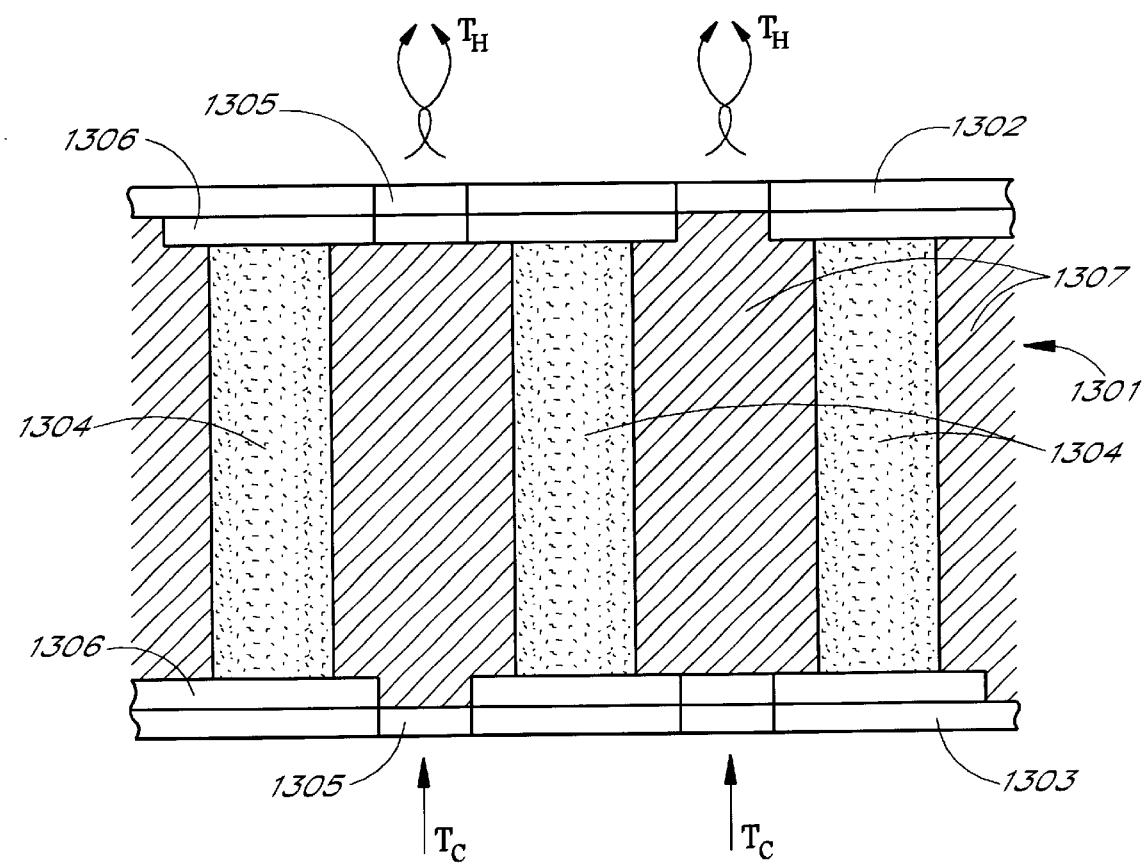
FIGS. 13A and 13B depict a detailed illustration of a portion of the TE element array showing convection along the length of the TE elements with additional mixing created by vanes.
Figure 13B:
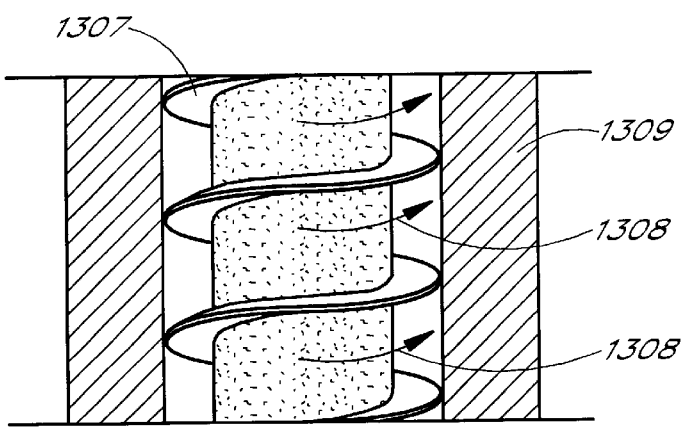

FIGS. 13A and B show a TE array constructed like that of FIG. 6 with the addition of a heat transfer feature. In this embodiment, the heat transfer feature is between the TE elements 1304. In this Figure, the heat transfer feature is a flow-disturbing feature formed from vanes 1307. One example of such vanes is depicted in additional detail in FIG. 13B. The vanes serve to duct the heat transfer fluid 1308 in a spiral path thereby increasing the heat transfer. Thermal insulation 1309 can be placed around the space that encloses vanes 1307 to further duct the fluid 1308 and enhance heat transfer. As with FIG. 10, other features that improves heat transfer between the thermoelectric elements and the convective medium are possible.

Figure 14A:
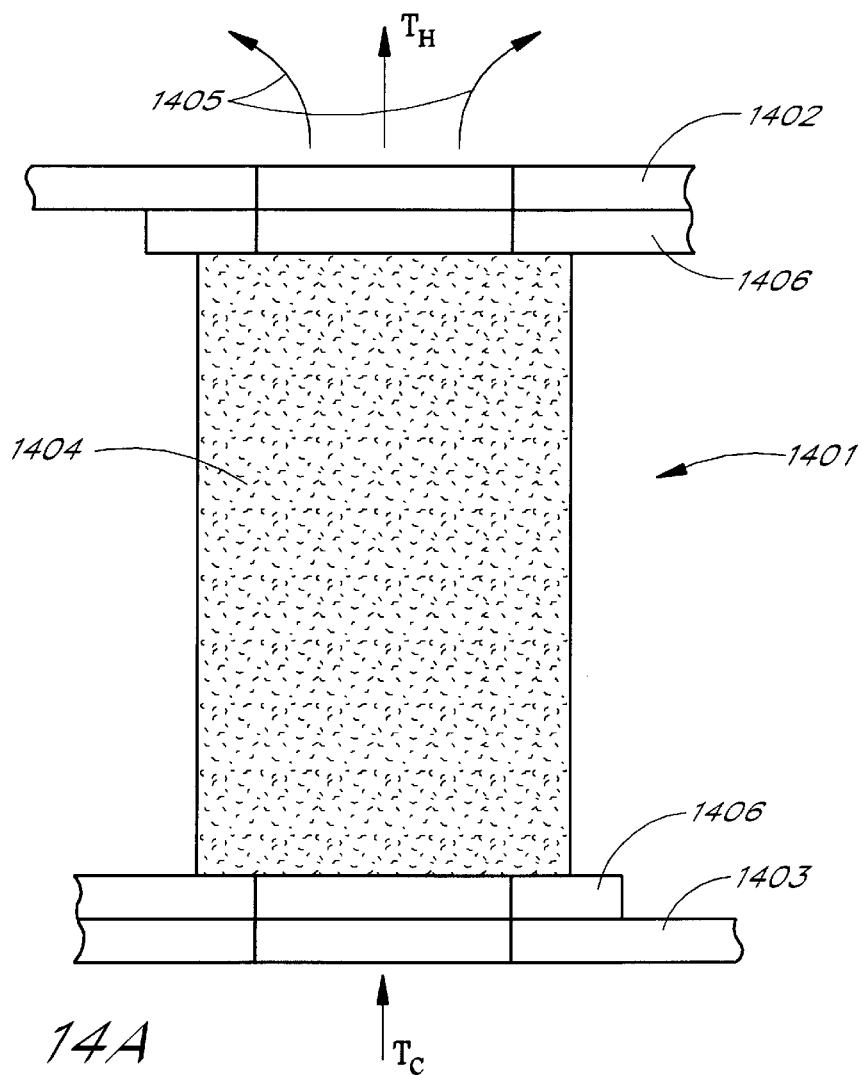
FIGS. 14A and 14B depict a detailed illustration of a portion of the TE element array showing a TE element with a honeycomb structure.
Figure 14B:
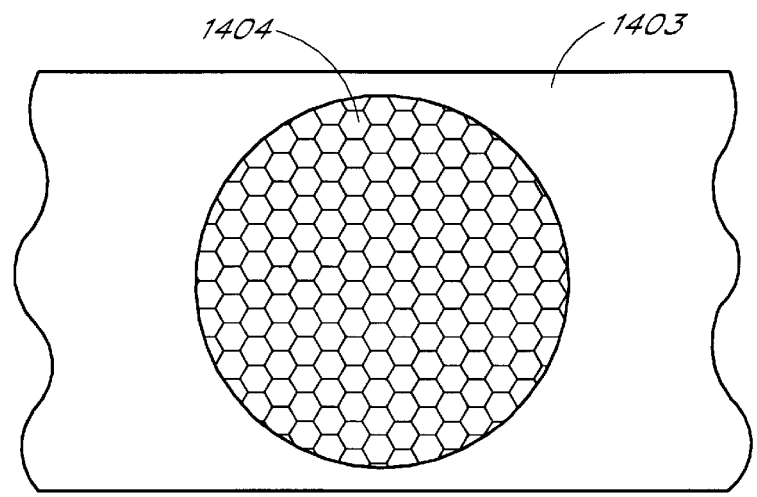

FIG. 14 shows a TE array 1401 constructed similar to that of FIG. 6 with hot and cold side substrates 1402 and 1403, and circuitry 1406 but with the TE elements 1404 allowing fluid to move through them by constructing them with a honeycomb configuration as depicted in FIG. 14B. The large surface area of the honeycomb increases the heat transfer to the heat transfer fluid 1405.

Figure 15:
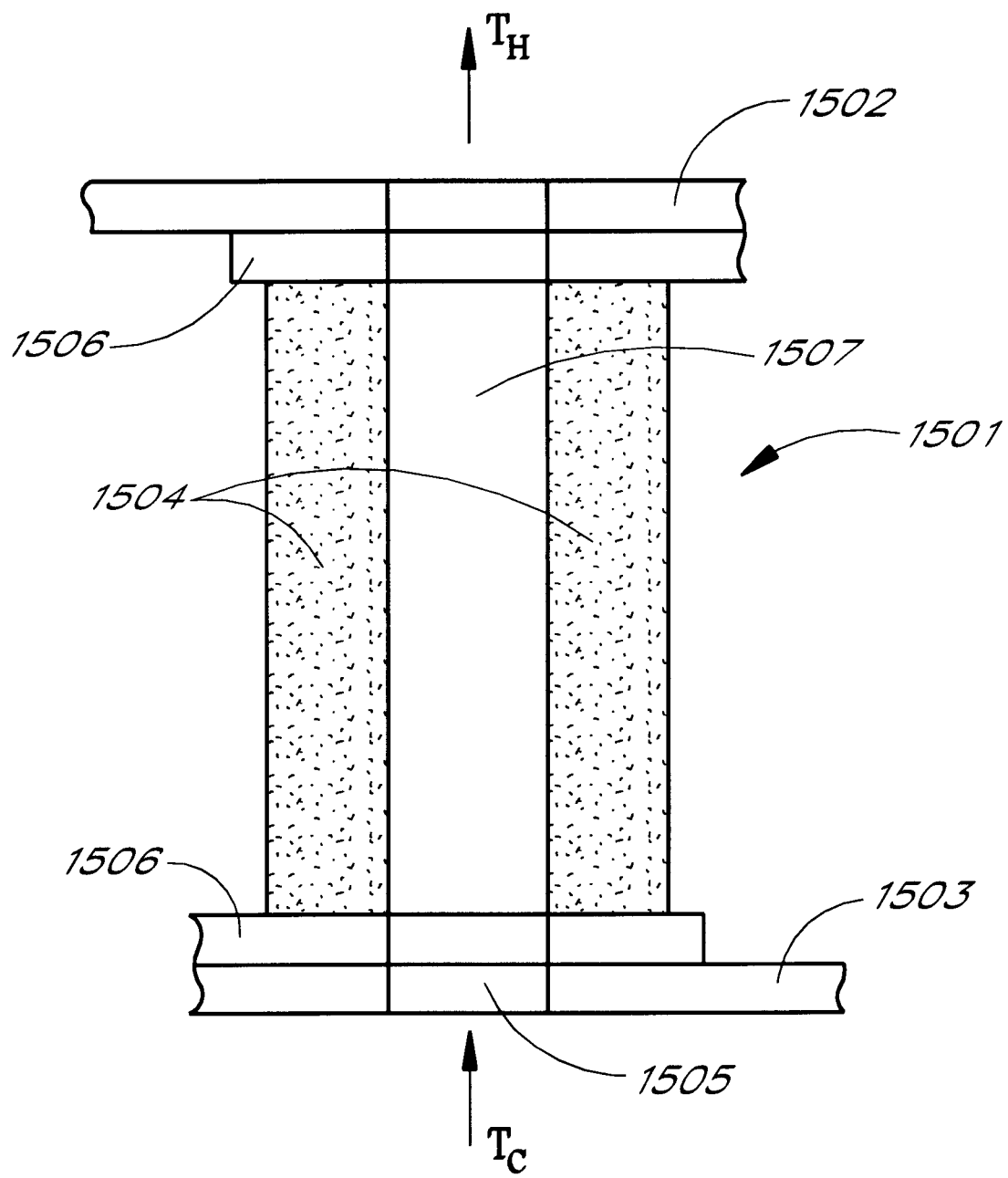
FIG. 15 depicts a portion of a tubular TE element array.

FIGS. 4 and 6 illustrate convective heat transport using an unspecified type of convective heat transport fluid. FIGS. 15 through 20 disclose several examples of specific types of convective heat transport fluid. FIG. 15 depicts the use of an inert fluid such as air. In the portion of the TE element array 1501 shown in FIG. 15, the TE element 1504 is constructed as a hollow tube electrically connected with circuitry 1506 and sandwiched between hot and cold substrates 1502 and 1503. Air 1507 enters through holes in the substrate and circuitry 1505 at the cold side at temperature $T_C$ and exits at temperature $T_H$. This type of convective heat transport fluid may be used not only with the tubular construction shown in FIG. 15, but may also be used with the TE element construction of FIGS. 4 and 6; the TE element construction having flow disturbing features as described in FIGS. 10 and 13; the concentric tubes of FIG. 11; the flow around TE elements of FIG. 12, the honeycomb construction of FIG. 14, or any other structure that accomplishes the convective heat transfer described in this application.

Figure 16:
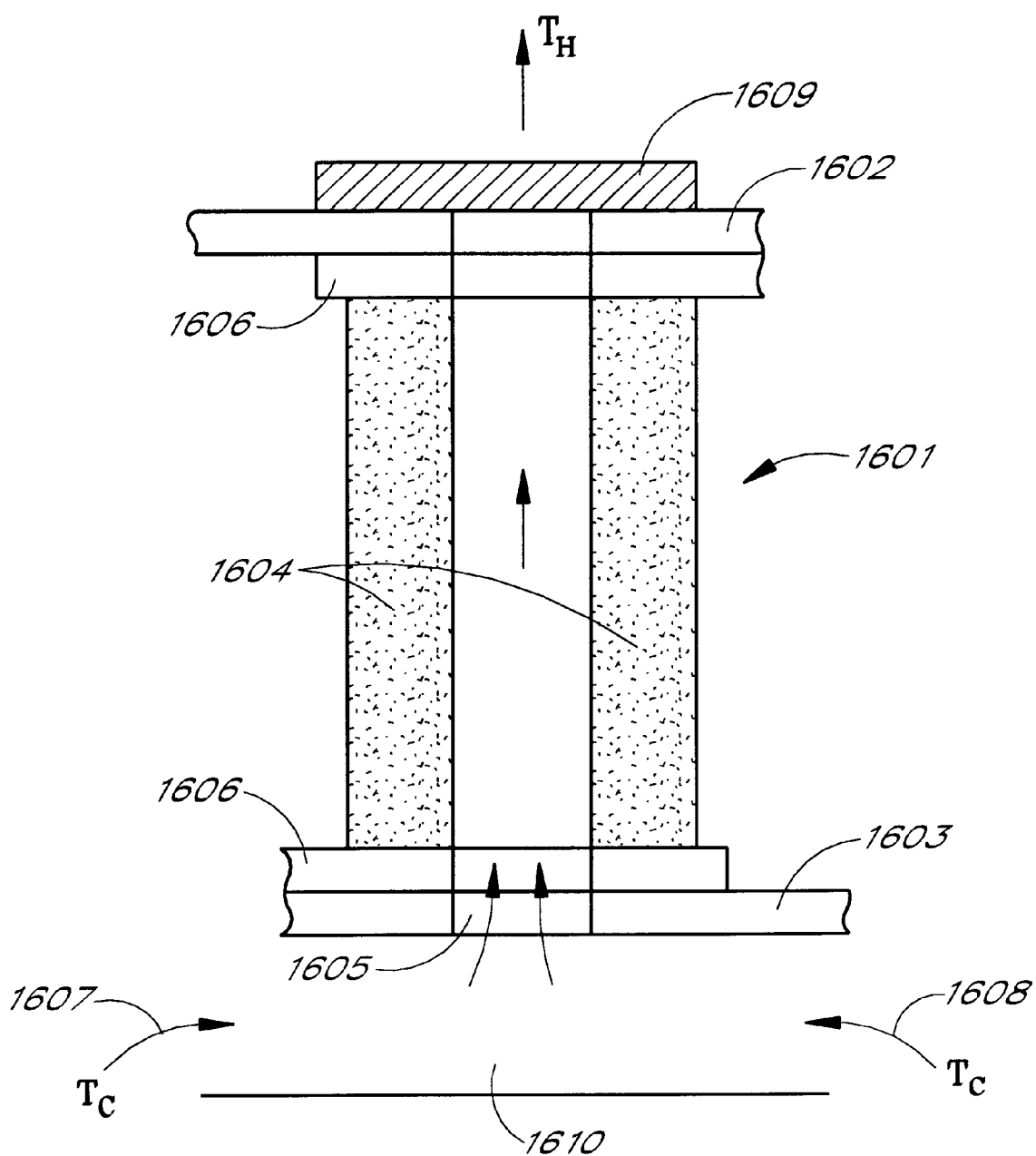
FIG. 16 depicts a portion of the TE element array showing the use of reactant fluids as the convective heat transport fluid with mixing before entering the TE array.
Figure 17:
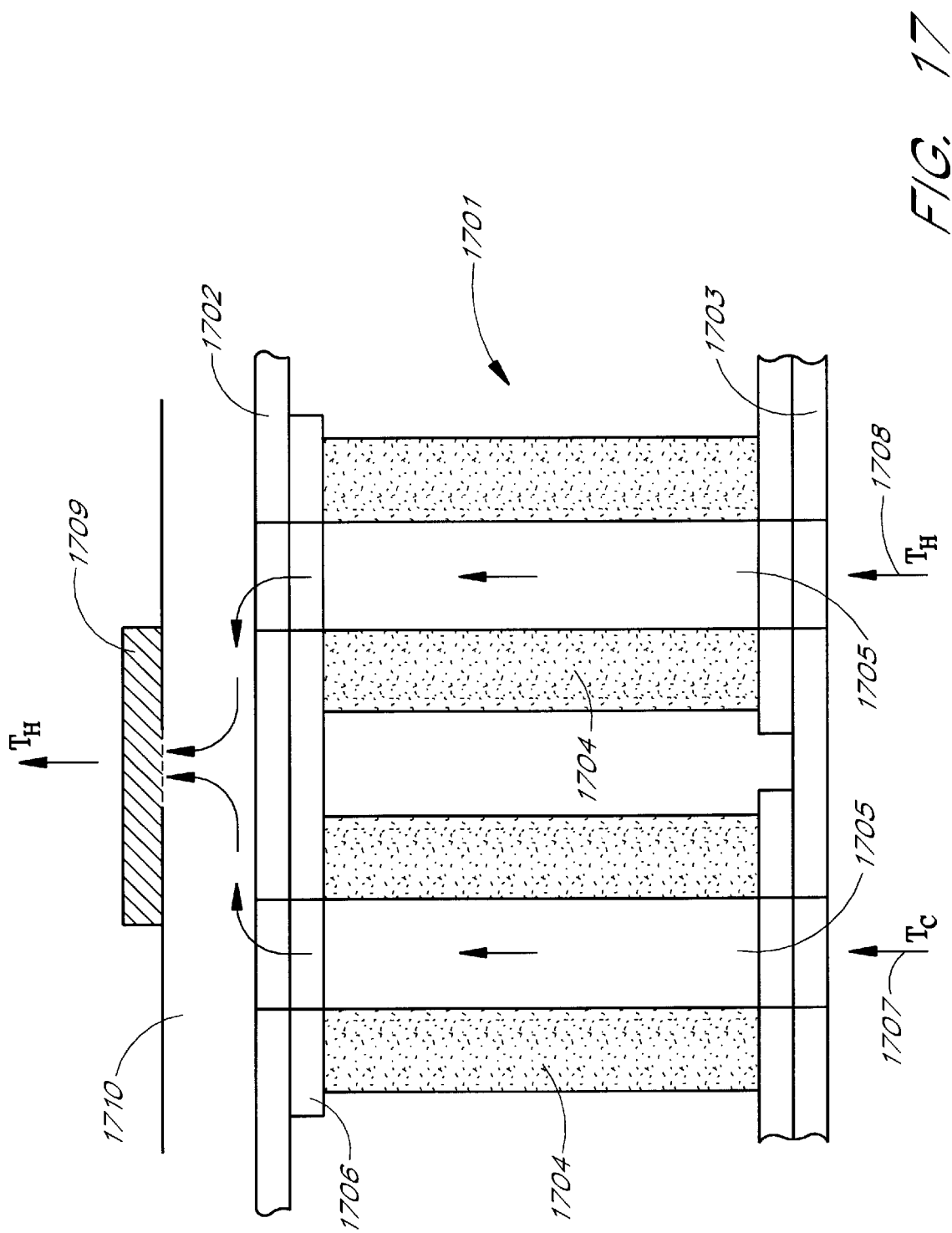
FIG. 17 depicts a portion of the TE element array showing the use of reactant fluids as the convective heat transport fluid with mixing after exiting the TE array.

FIGS. 16 and 17 illustrate TE element constructions for use with a convective fluid consisting of one or more reactants and depict a portion of the TE element array of FIG. 4. In the portion of the TE element array 1601 shown in FIG. 16, the TE element 1604 is constructed as a hollow tube electrically connected with circuitry 1606 and sandwiched between hot and cold substrates 1602 and 1603. One or more of the reactant fluids 1607 and 1608 enter through a mixing chamber 1610 and then enter the TE elements 1604 through holes in the substrate and circuitry 1605 at the cold side at temperature $T_C$ and exit at temperature $T_H$. The mixed and heated fluids pass through a catalyst section 1609 and react. The catalyst section 1609 need not be present if the reaction can proceed by virtue of its temperature $T_H$ alone. This type of convective heat transport fluid may be used not only with the tubular construction shown in FIG. 16, but may also be used with the TE element construction of FIG. 4; the TE element construction having flow disturbing features as described in FIGS. 10 and 13; the concentric tubes of FIG. 11; the flow around TE elements of FIG. 12, the honeycomb construction of FIG. 14, and any other configuration that provides or permites convective heat transport as explained in this application.

The portion of the TE element array 1701 shown in FIG. 17 is similar to that of FIG. 16, but mixing of reactants occurs at the exit from the array. In this particular illustration, the TE elements 1704 are constructed as hollow tubes electrically connected with circuitry 1706 and sandwiched between hot and cold substrates 1702 and 1703. One or more reactant fluids 1707 and 1708 enter the TE elements 1704 through holes in the substrate and circuitry 1705 at the cold side at temperature $T_C$ and exit at temperature $T_H$ into a mixing chamber 1710. The mixed and heated fluids pass through a catalyst section 1709 and react. The catalyst section 1709 need not be present if the reaction can proceed by virtue of its temperature $T_H$. This type of convective heat transport fluid may be used not only with the tubular construction shown in FIG. 17, but may also be used with a porous TE element construction of FIG. 4; the TE element construction having flow disturbing features as described in FIGS. 10 and 13; the concentric tubes of FIG. 11; the flow around TE elements of FIG. 12, the honeycomb construction of FIG. 14, or any configuration that permits the heat convection described in this application.

The choice of mixing reactant fluids before or after passing through the TE array is made on the basis of properties of the reactant fluids, their effect on TE element material, or other considerations such as geometric or cost constraints on the generator as a whole. If mixed afterwards as shown in FIG. 17, the route taken by each of the reactants through particular TE elements is arbitrary for the purposes of convective heat transport and may be determined by other considerations. For example, one of the reactants may damage say, N-type TE material so that such a reactant would be passed only through P-type material.

Figure 18:
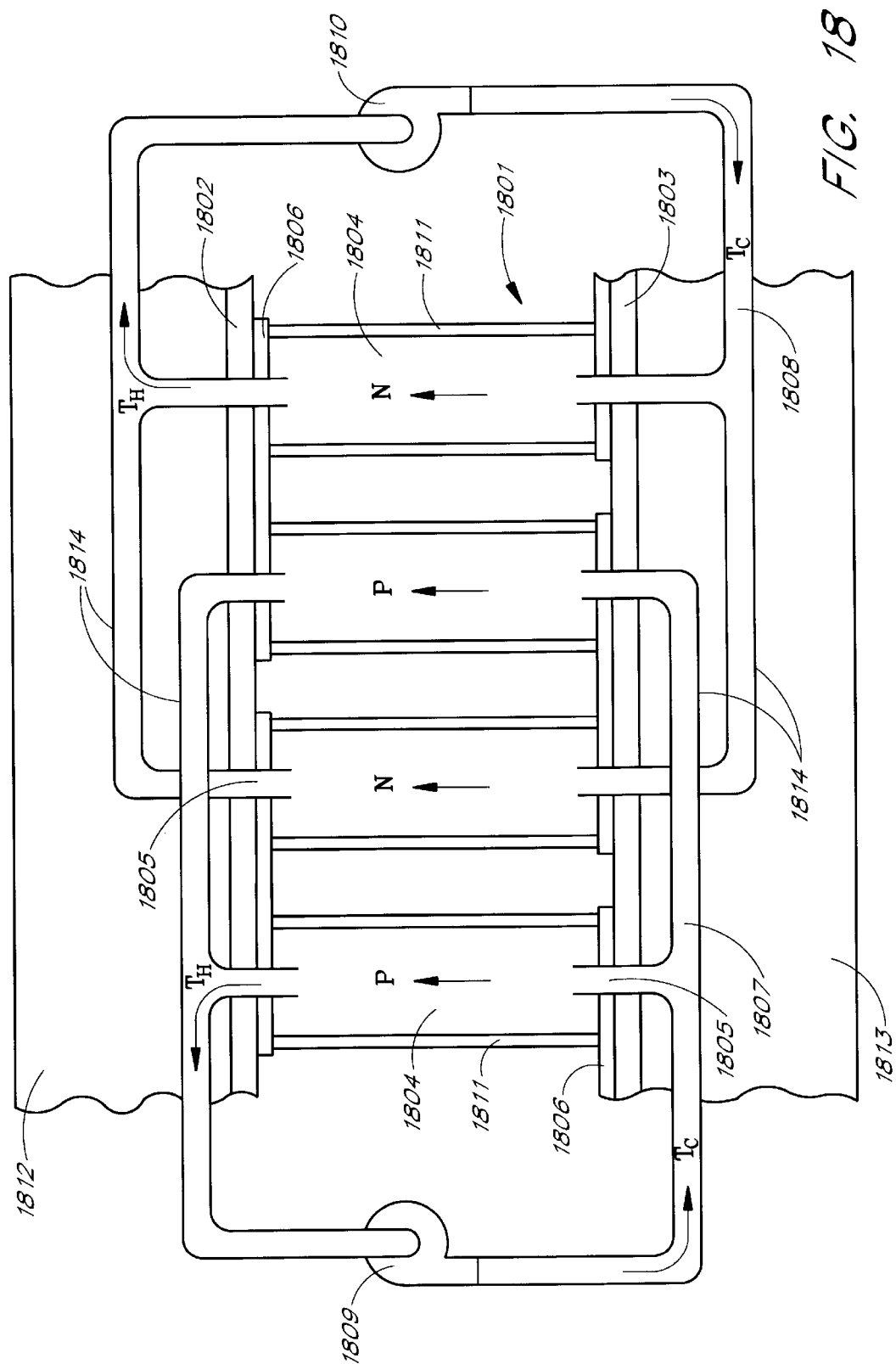
FIG. 18 depicts a portion of the TE power generator with convective heat transfer using liquid TE materials as the convective heat transport fluid.

FIG. 18 shows a portion of a TE power generator in which liquid TE materials form at least a portion of the TE elements. As shown, the array 1801 is composed of a heat source 1812 at temperature $T_H$, a heat sink 1813 at temperature $T_C$. Within the heat source 1812 and heat sink 1813 are channels 1814 that direct P-type and N-type fluid TE materials toward holes 1805 in circuitry 1806 and the hot side substrate 1802 and cold side substrate 1803. The TE fluids 1807 and 1808 are heated to temperature $T_H$ as they pass through the tubes 1811 toward the hot side heat source 1812 and are returned to temperature $T_C$ within the heat sink 1813. Preferably, the tubes 1811 are insulative. Pumps 1809 (for P-type material) and 1810 (for N-type material) propel the TE fluids 1807 and 1808.

One example of liquid TE materials is a mixture of thallium and tellurium (P-type) at temperatures (above room temperature) where it becomes liquid, and a mixture of mercury/rubidium (N-type). Some such materials are described by A. F. Loffe, in Semiconductor Thermal Elements, and Thermoelectric Cooling, Infosearch, London, 1957. Another example is P-type bismuth telluride slurried in mercury and N-type bismuth telluride slurried in mercury.

Although FIG. 18 illustrates the use of both N- and P-type liquid TE materials, in some applications it may be desirable to use a liquid TE material for only one type and a solid, porous, tubular or honeycomb TE material for the other with some other fluid being the convective heat transport agent within those elements.

Figure 19:
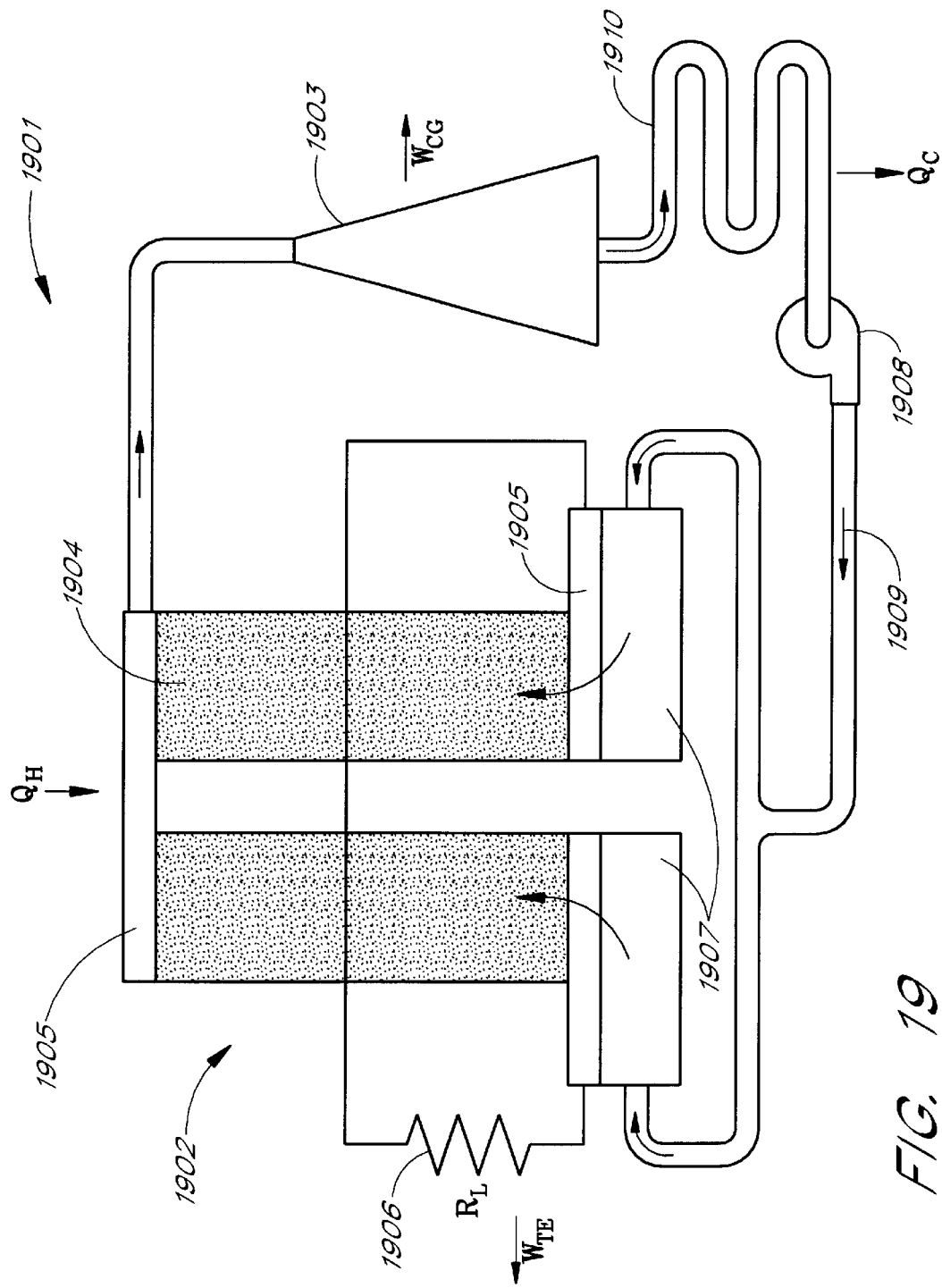
FIG. 19 depicts an example of the integration of a thermoelectric power generating device that employs convective fluid used as the working fluid of a co-generator.

FIGS. 19 through 22 illustrate examples of the way a thermoelectric generator with convective heat transfer may be integrated with co-generating devices. FIG. 19 depicts a co-generating system 1901 in which a thermoelectric power generator 1902 is integrated with a co-generator 1903. The thermoelectric power generator 1902 is constructed with thermoelectric elements (or arrays of elements) 1904 (only two shown for simplicity) which are constructed similar to any of those described above and shunts 1905 electrically connecting the thermoelectric elements in series. The load 1906 is represented by $R_L$ and is attached to the thermoelectric power generator 1902 at the ends of the series shunt circuit resulting in the generation of work $W_{TE}$. At the cool side of the thermoelectric elements is a boiler 1907 in good thermal contact with the cool side shunts. The convective fluid 1909 is circulated through the system by the pump 1908 that also pressurizes the fluid. The convective fluid 1909 may be an alcohol, a low molecular weight hydrocarbon such as hexane, water, or some other suitable fluid with a relatively low boiling point so that it may be used in an expansion or change of phase co-generation system. For example, water phase changed to steam, that then drives a turbine co-generator. The convective fluid 1909 exits the thermoelectric power generator 1902 at the hot side and is passed to the co-generator 1903 that generates work $W_{CG}$. As the heat source $q_H$ is applied, some heat is conducted through the thermoelectric elements 1904 from the hot side to the cold side and is absorbed by the high pressure fluid in the boiler 1907 at the cold side. The absorbed heat causes the phase change of the convective fluid 1909 from high pressure liquid to high pressure gas at the cold ends of the TE elements 1904 when the pressure, heat flow, and material properties are chosen properly. The boiler 1907 therefore acts as a very good heat sink, maintaining the temperature of the cold side at or near $T_C$. As the convective fluid 1909 (now a gas) traverses the length of the TE elements 1904 it absorbs even more heat exiting the hot side of the TE elements 1904 at high temperature ($q_H$) and at high pressure. It is then used as the working fluid within the co-generator 1903. The fluid 1910, cooled somewhat as it passes through the co-generator 1903, is then returned to temperature $T_C$ at low pressure by the condenser 1910 to be recycled again through the system. Waste heat exits the system from the condenser 1910 as $q_C$.

Figure 20:
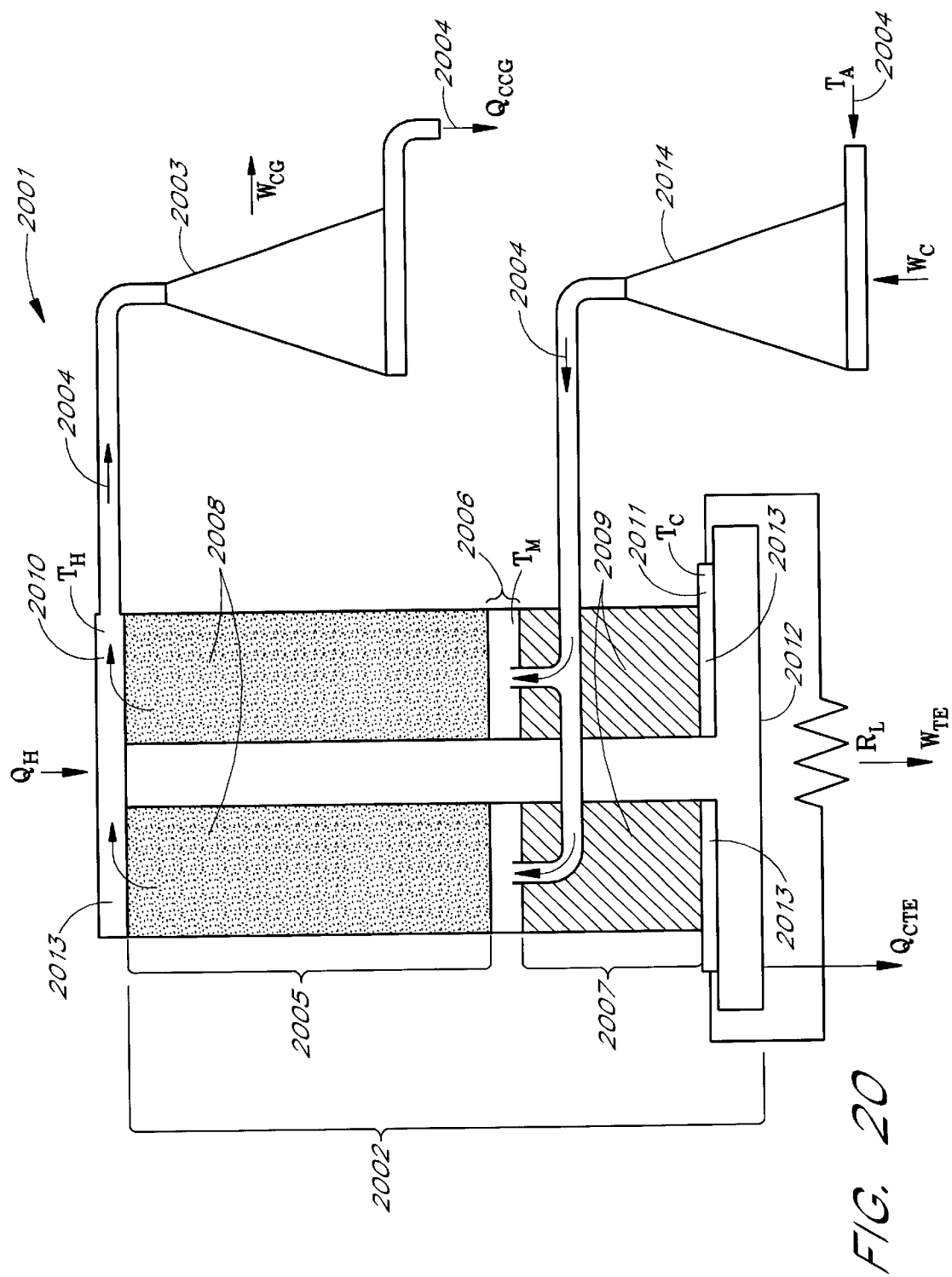
FIG. 20 depicts another example of the integration of a thermoelectric power generating device with air as the working fluid for a turbine generator.

FIG. 20 illustrates a co-generation system 2001 combining a thermoelectric power generator 2002 with a co-generator such as a turbine 2003. In one embodiment, air 2004 is the convective fluid for the TE generator 2002 and the working medium for the co-generating turbine 2003. The TE generator 2002 is constructed in sections: a convective power generating zone 2005, an air entry zone 2006, and a power generating zone 2007 which may be either convective or non-convective; as shown it is non-convective. The convective zone 2005 is constructed with TE elements 2008 that may be any of the types described above, or of any other type permitting convective heat transport. Only two legs of the thermoelectric array are shown for simplicity in FIG. 20. The TE generator 2002 has a hot side 2010 maintained at temperature $T_H$ by the heat source $q_H$ and a cold side 2011 maintained at temperature $T_C$ (near ambient) by the radiator 2012 that removes waste heat $q_{CTE}$. The convective TE elements 2008 are electrically connected at their hot ends by shunts 2013. Non-convective TE elements 2009 are electrically connected with shunts at their cold ends by similar shunts. The cooler ends of the convective TE elements 2008 and the warmer ends of the non-convective TE elements 2009 are electrically connected to one another while maintaining the ability to introduce air 2004 in the air entry zone 2006. Overall, the TE elements 2008 and 2009 are connected in series by the shunts 2013.

Air 2004 enters the system 2001 at the compressor 2014 at ambient temperature $T_A$. The energy needed to operate this compressor is represented by $W_C$. The air 2004 then enters the air entry zone 2006 at temperature $T_M$ by virtue of the compression heating caused by the compressor 2014. Temperature $T_M$ is less than $T_H$ and greater than $T_C$. Thus the temperature differential $T_H - T_M$ across the convective zone 2005 and the difference $T_M - T_C$ across the non-convective zone 2006 together give rise to thermoelectric power generation in both zones. The zone concept is advantageous because turbine generators require a high pressure, high temperature working fluid. Since this working fluid can be used as the convective fluid too, the cooler end of the convective elements will not be as cool as ambient. The addition of the non-convective zone is to utilize what otherwise would be wasted heat.

As the air 2004 passes from the air entry zone 2006 to the hot side 2010 of the TE generator 2002, it increases in temperature to $T_H$ and is passed to the turbine generator 2003. The air 2004 carrying waste heat $q_{CCG}$ is expelled from the turbine generator at a relatively low temperature.

The overall efficiency of the system 2001 is given by:

$$\eta = \frac{W_{TE} + W_{CG} - W_C}{q_H} \tag{18}$$

Although FIG. 20 illustrated a TE power generator combined with a turbine co-generator, other types of co-generation combinations are possible whenever there is a need to add significant heat to the co-generator's working fluid. See Saad, Michel A., *Thermodynamics: Principles and Practice*, Prentice Hall, Upper Saddle River, N.J., 07458, 1997, for examples of numerous thermodynamic cycles having this property. For instance, an internal combustion engine, gasoline or diesel, is combined with a TE generator in which the hot side of the TE generator is thermally coupled to the site of combustion and the fuel and/or oxidizer is used as the convective fluid through the TE generator. The same idea can also be applied to an external combustion engine such as a Stirling engine. In these cases, the hot combustion products may be utilized in addition to supply a source of heat to a secondary TE generator. The coupling of the source of heat to the hot side of the TE generator may be direct with combustion taking place in contact with the hot side, or it may be transferred to the hot side of the TE generator from the source by heat exchangers.

Figure 21:
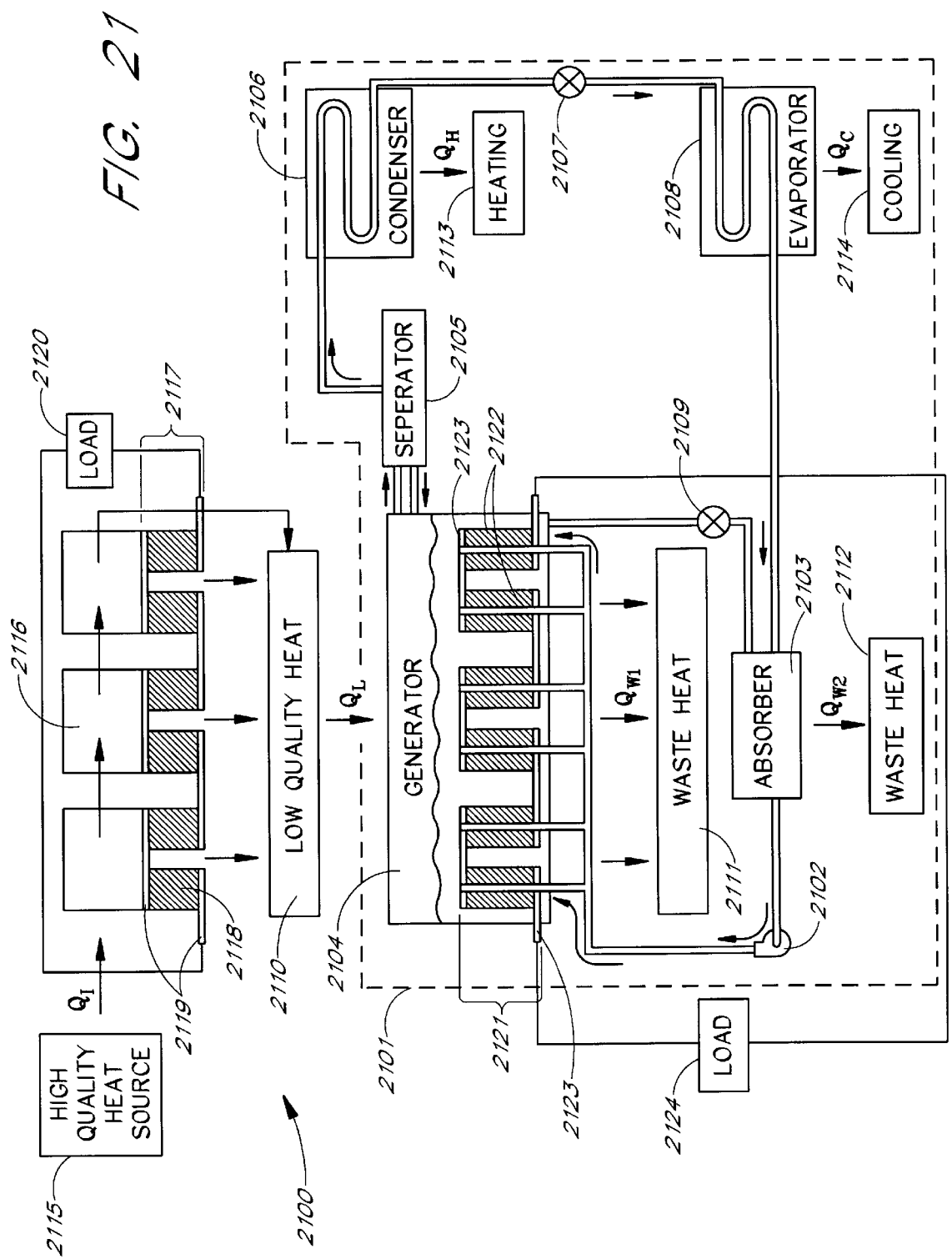
FIG. 21 illustrates an example of the integration of a thermoelectric power generating device with an absorption heating and cooling system.

FIG. 21 illustrates a thermoelectric power generator 2100 combined with a cooling and/or heating system, such as an absorption system 2102. The absorption system 2101 is shown within the dashed line. The absorption system 2101 operates as described in Saad, pp. 442, 443. Although other working fluids are possible such as water absorbing in LiBr, the example herein uses ammonia absorbing in water. It consists of a pump 2102 to circulate the solution thoughout the mechanism as indicated by the arrows next to the flow tubes, an absorber 2103 in which ammonia is absorbed in water in an exothermic reaction, a generator 2104 in which the ammonia separates from the water in an endothermic reaction, a separator 2105 to further separate any water vapor carried by the ammonia vapor, a condenser 2106 to condense the ammonia vapor, and expansion valve 2107, and an evaporator 2108. Separated water is returned to the absorber 2103 through a valve 2109. The source of power to the generator 2104 is the low quality heat ($Q_L$) 2110. Waste heat ($Q_{W1}$) 2111 from the generator, if any, is exhausted through a heat exchanger, not shown. The absorber 2103 must be cooled to maintain its lower temperature approximately constant. This may be accomplished with any standard means such as the removal of waste heat ($Q_{W2}$) 2112 using a finned heat exchanger (not shown) with air passing through it. Heat ($Q_H$) 2113 removed at the condenser 2106 may be used for heating, or may be treated as waste heat if no heating function is required. Heat ($Q_C$) 2114 is extracted from the environment by the evaporator 2108.

A high quality heat source 2115 powers the entire system 2100. For example, heat from a combustion process ($Q_I$) passes into the system as hot air and is passed through heat exchangers 2116. The heat exchangers 2116 are in good thermal contact with the hot side of a thermoelectric array 2117 composed of thermoelectric elements 2118 which are connected electrically in series by shunts 2119. The cold side of the thermoelectric array 2117 is in good thermal contact with the generator 2104 or may be connected thermally to the generator 2104 by means of heat pipes or other means of transferring heat. In usage with a combustion process, reactants, if gaseous or liquid, could pass through the TE elements 2118 so as to achieve the convective heat transport from the cold side to the hot side of the thermoelectric array 2117. Air exiting the heat exchangers is passed to the generator 2104. The temperature of the air and therefore the heat exchangers 2116 is higher than the temperature of the generator 2104. This temperature difference across the thermoelectric array 2117 causes the array 2117 to be a thermoelectric generator as described previously. The electrical output of the array is utilized within the load 2120. Thus the thermoelectric array 2117 generates power from a high quality heat source 2115 and its "waste" heat is utilized to power the absorption system.

Within the generator is a second thermoelectric array 2121 composed of thermoelectric elements 2122 that are electrically connected in series by shunts 2123. The thermoelectric elements 2122 are constructed like those described above so as to allow the passage of the absorption system working fluid through them (shown in FIG. 21 as hollow tubes). The hot side of the thermoelectric array 2122 is in good thermal contact with the means of transporting the low quality heat. The cold side of the thermoelectric array 2122 is in good thermal contact with a heat sink or heat exchanger (not shown). The temperature difference across the thermoelectric array 2122 causes the array 2122 to also act as a thermoelectric generator, thereby utilizing additional low grade heat to product electricity. The electrical power output of the thermoelectric array 2122 is utilized within the load 2124.

Figure 22:
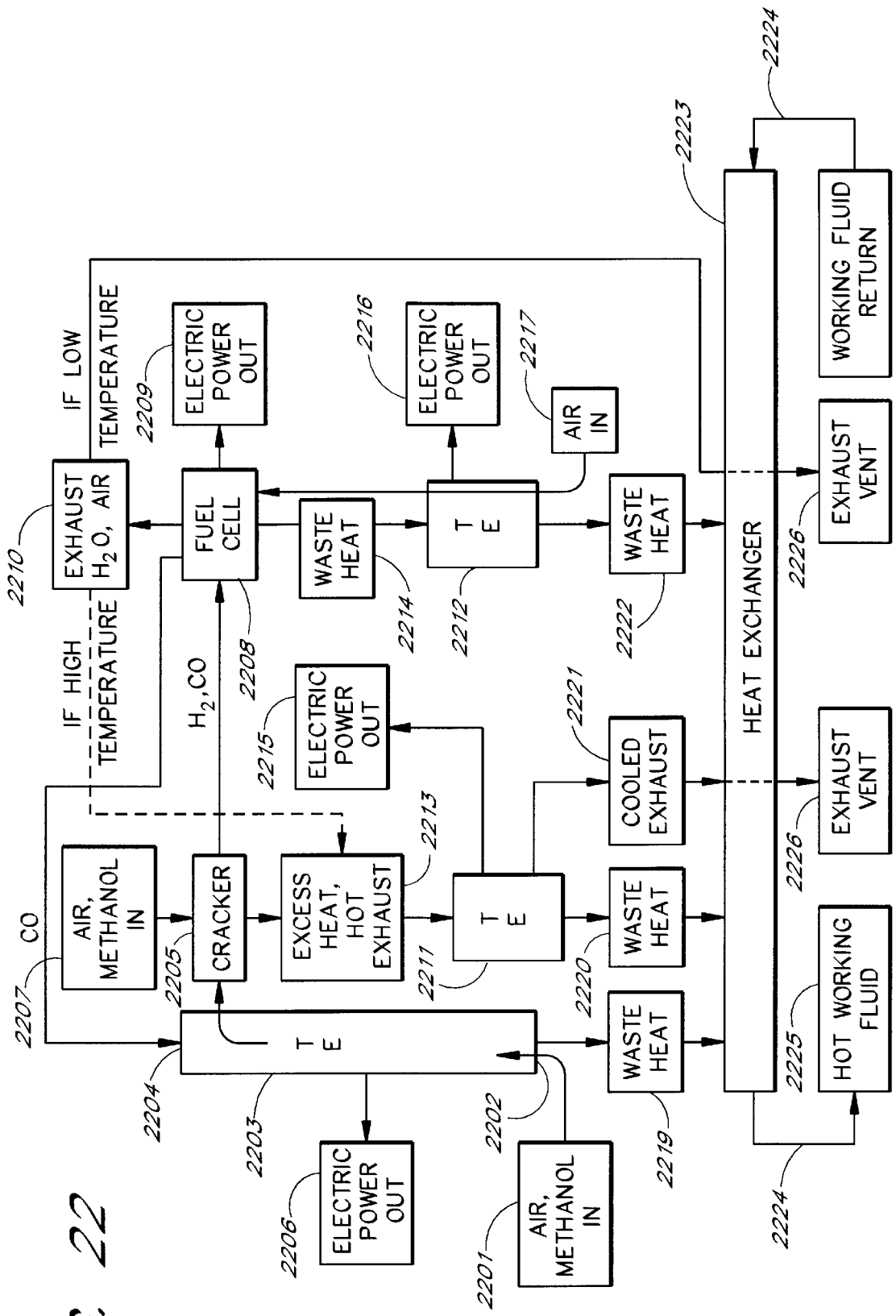
FIG. 22 illustrates an example of the integration of a thermoelectric power generating device with a fuel cell system.

FIG. 22 depicts a power generating system 2200 in which thermoelectric power generating devices are integrated with an electrochemical co-generator. In this embodiment, the electrochemical process is a fuel cell. Other electrochemical processes are also possible. The hot gases inherent in some fuel cell systems that are normally wasted are utilized to supply power to the thermoelectric devices to create additional electricity. The fuel cell portion of the system shown is similar to that developed by Böhm and Maass and described in Angrist, Stanley W., *Direct Energy Conversion*, $3^{rd}$ edition, Allyn and Bacon, Inc., Boston, Mass. 2210, USA, (1976), pp. 401–403. The description that follows herein uses methanol as the fuel and air as the oxidizer as an illustrative example of how the thermoelectric power generating devices are combined with the fuel cell system. Other types of fuel cells using different fuels with different exhaust products and operating at different temperatures may be substituted for the device described herein by adjusting the nature of the thermoelectric devices to be compatible with those differences. Some of the elements of the fuel cell part of the system are omitted from the description because they are ancillary to the purpose of describing the subject invention.

Air and methanol 2201 are introduced into the cold end 2202 of a primary thermoelectric power generator 2003 to produce convective heat transfer. The convective transport is used to enhance the performance of the TE generator 2203 as described above. At the hot end 2204 of the TE generator 2203 combustion creates the heat necessary to operate the cracker 2205. The TE generator 2203 generates electric power output 2206. Air and methanol 2207 are introduced to the cracker 2205 and are converted therein to hydrogen and carbon monoxide. These gases are passed to the fuel cell 2208. Within the fuel cell 2208 electricity 2209 is produced and air and water (as steam) 2210 are exhausted for further use as described below. The carbon monoxide is returned to the hot end 2204 of the primary TE generator 2203 to be burned along with the original methanol-air mixture 2201.

As shown as an example, waste heat 2213 from the cracker 2205 and waste heat 2214 from the fuel cell 2208 can be used to power secondary thermoelectric power generating devices 2211 and 2212 which generate electrical power 2215 and 2216 respectively if the system operates so that net benefit would result. If a different fuel cell system were employed, its exhaust products 2210 may be at a high enough temperature that they may add to the source of heat for the secondary TE generator 2211 and would be introduced near the hot end of TE generator 2211 or to the waste heat 2213 (dotted line in FIG. 22). As shown in FIG. 22 as an example, the exhaust products 2210 of the fuel cell 2208 are at a relatively low temperature and are used for auxiliary heating as described below. Either or both of the two secondary TE generators 2211 and 2212 utilized or omitted. Either or both may be conventional TE generators or may employ convective heat transfer according to the principles described above. By way of example, in FIG. 22, secondary TE generator 2212 employs convective heat transfer by utilizing the air 2217 needed to operate the fuel cell 2208.

The remaining waste heat sources, 2219 from the primary TE generator 2203, 2220 from secondary TE generator 2211, 2221 the cooled exhaust having passed through secondary TE generator 2211, and 2222 the waste heat from secondary TE generator 2212 may be passed through a heat exchanger 2223 if advantageous. Within heat exchanger 2223 a working fluid 2224 is heated, and as shown, passes from right to left in the figure and exits at 2225. This hot working fluid 2225 may be then be used for some other purpose such as space heating. The working fluid 2224 is returned to the right end of the heat exchanger 2223. Advantageously, the actual sequence for the working fluid 2225 is selected so as to maximize the benefits to the thermoelectric system of its cooling capacity. The exhaust 2226, now cooled to near room temperature, from fluids routed through the heat exchanger 2223 is simply vented.

What is claimed is:

1. A thermoelectric power generator system comprising:
a plurality of thermoelectric elements forming at least one thermoelectric array with at least one first side and at least one second side exhibiting a temperature gradient between them during operation, wherein at least a portion of the at least one thermoelectric array is configured to permit generally steady-state convective heat transport toward at least one side of at least a portion of the thermoelectric array.

2. The thermoelectric power generator of claim 1, wherein at least one convective medium flows through the at least a portion of the array to provide the generally steady-state convective heat transport, wherein the at least one convective medium flows generally from the at least one first side to the at least one second side.

3. The thermoelectric power generator of claim 2, wherein the at least one convective medium flows along at least some of the thermoelectric elements.

4. The thermoelectric power generator of claim 2, wherein the at least one convective medium flows along at least some of the thermoelectric elements and through at least some of the thermoelectric elements.

5. The thermoelectric power generator of claim 2, wherein the at least one convective medium flows through at least some of the thermoelectric elements.

6. The thermoelectric power generator of claim 5, wherein at least some of the thermoelectric elements are permeable.

7. The thermoelectric power generator of claim 6, wherein at least some of the thermoelectric elements are porous.

8. The thermoelectric power generator of claim 5, wherein at least some of the thermoelectric elements are a honeycomb structure.

9. The thermoelectric power generator of claim 5, wherein at least some of the thermoelectric elements are tubular.

10. The thermoelectric power generator of claim 9, wherein at least some of the tubular elements are constructed of at least one thermoelectric material of a first conductivity type, and at least some of the tubular elements are constructed of at least one thermoelectric material of a second conductivity type.

11. The thermoelectric power generator of claim 9, wherein at least one first set of concentric tubes forms at least one thermoelectric element.

12. The thermoelectric power generator of claim 11, wherein at least some of the concentric tubes alternate between thermoelectric material of a first conductivity type, and thermoelectric material of a second conductivity type.

13. The thermoelectric power generator of claim 2, wherein at least a portion of the array comprises at least one heat transfer feature that improves heat transfer between at least some of the convective medium and at least a portion of the at least one thermoelectric array.

14. The thermoelectric power generator of claim 13, wherein at least some of the thermoelectric elements are tubular, and wherein the at least one heat transfer feature is inside at least some of the tubular thermoelectric elements.

15. The thermoelectric power generator of claim 13, wherein the at least one heat transfer feature is between at least some of the thermoelectric elements.

16. The thermoelectric power generator of claim 13, wherein the at least one heat transfer feature is at least one convective medium flow disturbing feature.

17. The thermoelectric power generator of claim 2, wherein a first plurality of thermoelectric elements is configured for heat transport of a first type and a second plurality of thermoelectric elements is configured for convective heat transport of a second type.

18. The thermoelectric power generator of claim 2, wherein at least part of the at least one convective medium is at least one thermoelectric material, said convective medium thermoelectric material also forming at least some of the thermoelectric elements.

19. The thermoelectric power generator of claim 2, wherein at least part of the at least one convective medium is at least one thermoelectric material, said convective medium thermoelectric material forming a portion of at least some of the thermoelectric elements, and at least one solid thermoelectric material forming a second portion of the same thermoelectric elements.

20. The thermoelectric power generator of claim 2, wherein at least part of the at least one convective medium is at least one fluid.

21. The thermoelectric power generator of claim 20, wherein at least a portion of the at least one convective medium is at least one gas.

22. The thermoelectric power generator of claim 20, wherein at least a portion of the at least one convective medium is at least one fuel.

23. The thermoelectric power generator of claim 20, wherein at least a portion of the at least one convective medium is at least one working material also used in a co-generation process.

24. The thermoelectric power generator of claim 2, wherein at least some of the thermoelectric elements are each formed of a thermoelectric array.

25. The thermoelectric power generator of claim 1, further comprising at least one co-generator configured to operate in conjunction with the thermoelectric power generation system with the convective medium as the co-generator working fluid.

26. The thermoelectric power generator of claim 25, wherein at least a portion of the at least one co-generator comprises at least one combustion process involving combustion of the at least one convective medium.

27. The thermoelectric power generator of claim 26, wherein the at least one co-generator comprises at least one internal combustion engine.

28. The thermoelectric power generator of claim 26, wherein the at least one co-generator comprises at least one external combustion engine.

29. The thermoelectric power generator of claim 26, wherein the at least one co-generator comprises at least one turbine generator.

30. The thermoelectric power generator of claim 25, wherein at least a portion of the at least one co-generator comprises at least one expansion process involving expansion of the at least one convective medium.

31. The thermoelectric power generator of claim 30, wherein the at least one co-generator comprises at least one turbine generator.

32. The thermoelectric power generator of claim 25, wherein at least a portion of the at least one co-generator comprises at least one phase change process in the at least one convective medium.

33. The thermoelectric power generator of claim 25, wherein at least a portion of the co-generator working fluid is water or steam.

34. The thermoelectric power generator of claim 25, wherein at least a portion of the at least one co-generator comprises at least one electrochemical process with the at least one convective medium.

35. The thermoelectric power generator of claim 34, wherein the at least one electrochemical process comprises at least one fuel cell.

36. The thermoelectric power generator of claim 1, further comprising at least one heating or cooling system configured to operate at least in part with the at least one convective medium.

37. The thermoelectric power generator of claim 36, wherein the at least one heating or cooling system comprises at least one absorption system.

38. A method of improving efficiency in a thermoelectric power generation system having a plurality of thermoelectric elements forming at least one thermoelectric array having at least one first side and at least one second side exhibiting at least one temperature gradient between them during operation of the thermoelectric power generation system through the introduction of heat to the system, the method comprising the steps of:
   actively convecting thermal power through at least a portion of the array in a generally steady-state manner; and
   generating power from the at least one thermoelectric array.

39. The method of claim 38, wherein the step of convecting heat comprises flowing at least one convective medium through at least a portion of the at least one thermoelectric array.

40. The method of claim 39, further comprising the step of co-generating power at least in part with said at least one convective medium.

41. The method of claim 40, wherein the step of co-generating comprises combusting at least a portion of the at least one convective medium in at least one co-generator.

42. The method of claim 41, wherein the at least one co-generator comprises at least one turbine generator.

43. The method of claim 40, wherein the step of co-generating comprises expansion of at least a portion of the at least one convective medium.

44. The method of claim 43, wherein the at least one co-generator comprises at least one turbine generator.

45. The method of claim 40, wherein the step of co-generating comprises at least one electrochemical process with at least a portion of the at least one convective medium.

46. The method of claim 45, wherein the at least one electrochemical process comprises at least one fuel cell.

47. The method of claim 40, further comprising the step of heating or cooling at least in part with the at least one convective medium.

48. The thermoelectric power generator of claim 47, wherein the heating or cooling system is at least one absorption system.

* * * * *